(12) United States Patent
Lin et al.

(10) Patent No.: US 9,831,177 B2
(45) Date of Patent: Nov. 28, 2017

(54) THROUGH VIA STRUCTURE

(71) Applicant: Taiwan Semiconductor Manufacturing Company, Ltd., Hsin-Chu (TW)

(72) Inventors: Yung-Chi Lin, Su-Lin (TW); Hsin-Yu Chen, Taipei (TW); Lin-Chih Huang, Hsin-Chu (TW); Tsang-Jiuh Wu, Hsin-Chu (TW); Wen-Chih Chiou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/828,110

(22) Filed: Aug. 17, 2015

(65) Prior Publication Data

US 2015/0357263 A1    Dec. 10, 2015

Related U.S. Application Data

(62) Division of application No. 13/619,233, filed on Sep. 14, 2012, now Pat. No. 9,112,007.

(51) Int. Cl.
*H01L 23/528* (2006.01)
*H01L 27/088* (2006.01)
(Continued)

(52) U.S. Cl.
CPC ...... *H01L 23/528* (2013.01); *H01L 21/76898* (2013.01); *H01L 23/3114* (2013.01); *H01L 23/3171* (2013.01); *H01L 23/481* (2013.01); *H01L 23/53238* (2013.01); *H01L 24/13* (2013.01); *H01L 27/088* (2013.01); *H01L 23/525* (2013.01); *H01L 23/53223* (2013.01); *H01L 23/53252* (2013.01); *H01L 23/53266* (2013.01); *H01L 23/53271* (2013.01); *H01L 24/05* (2013.01); *H01L 2224/0401* (2013.01); *H01L 2224/05024* (2013.01); *H01L 2224/0557* (2013.01); *H01L 2224/05567* (2013.01); *H01L 2224/05572* (2013.01); *H01L 2224/06181* (2013.01); *H01L 2224/13022* (2013.01);
(Continued)

(58) Field of Classification Search
None
See application file for complete search history.

(56) References Cited

U.S. PATENT DOCUMENTS 6,057,038 A * 5/2000 Terashita ............ B08B 7/0057
                                            252/299.01
6,774,039 B1    8/2004 Drewery
(Continued)

FOREIGN PATENT DOCUMENTS

CN    102299136 A    12/2011

*Primary Examiner* — Angel Roman
*Assistant Examiner* — Kevin Quinto
(74) *Attorney, Agent, or Firm* — Slater Matsil, LLP

(57) ABSTRACT

An apparatus comprises a through via formed in a substrate. The through via is coupled between a first side and a second side of the substrate. The through via comprises a bottom portion adjacent to the second side of the substrate, wherein the bottom portion is formed of a conductive material. The through via further comprises sidewall portions formed of the conductive material and a middle portion formed between the sidewall portions, wherein the middle portion is formed of a dielectric material.

20 Claims, 24 Drawing Sheets

(51) Int. Cl.
*H01L 23/31* (2006.01)
*H01L 23/48* (2006.01)
*H01L 21/768* (2006.01)
*H01L 23/525* (2006.01)
*H01L 23/532* (2006.01)
*H01L 23/00* (2006.01)

(52) U.S. Cl.
CPC ............... *H01L 2224/13025* (2013.01); *H01L 2224/13111* (2013.01); *H01L 2924/00014* (2013.01); *H01L 2924/12042* (2013.01); *H01L 2924/13091* (2013.01)

(56) References Cited

U.S. PATENT DOCUMENTS

| | | |
|---|---|---|
| 8,390,120 B2 | 3/2013 | Moon et al. |
| 2007/0228576 A1* | 10/2007 | Trezza ............... H01L 21/6835 257/774 |
| 2011/0200937 A1 | 8/2011 | Orihara et al. |
| 2011/0316168 A1 | 12/2011 | Moon et al. |

* cited by examiner

THROUGH VIA STRUCTURE

This application is a divisional of U.S. patent application Ser. No. 13/619,233, entitled "Through Via Structure and Method," filed on Sep. 14, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three dimensional integrated circuits have emerged as an effective alternative to further reduce the physical size of a semiconductor chip. In a three dimensional integrated circuit, active circuits such as logic, memory, processor circuits and/or the like are fabricated on different wafers and each wafer die is stacked on top of a packaging component using pick-and-place techniques. Much higher density can be achieved by employing three dimensional integrated circuits. In sum, three dimensional integrated circuits can achieve smaller form factors, cost-effectiveness, increased performance and lower power consumption.

In order to connect electrical circuits in the stacked semiconductor dies, through silicon vias are employed to provide a vertical connection channel through the body of stacked dies. Through silicon vias can be formed by using suitable techniques. For example, in order to form a through silicon via, an opening may be formed on an active side of the semiconductor substrate, wherein the opening extends deeper into the semiconductor substrate than the active devices of the semiconductor substrate. These openings may then be filled with a conductive material such as copper, aluminum, tungsten, silver, gold and/or the like. After the openings have been filled, the backside of the semiconductor substrate may be thinned through a thinning process such as a chemical mechanical polishing process or an etching process. The thinning process is applied to the backside of the substrate until the conductive material of the through silicon via is exposed.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, namely a through via structure of a semiconductor package. The embodiments of the disclosure may also be applied, however, to a variety of packages of the semiconductor industry. Hereinafter, various embodiments will be explained in detail with reference to the accompanying drawings.

Figure 1:
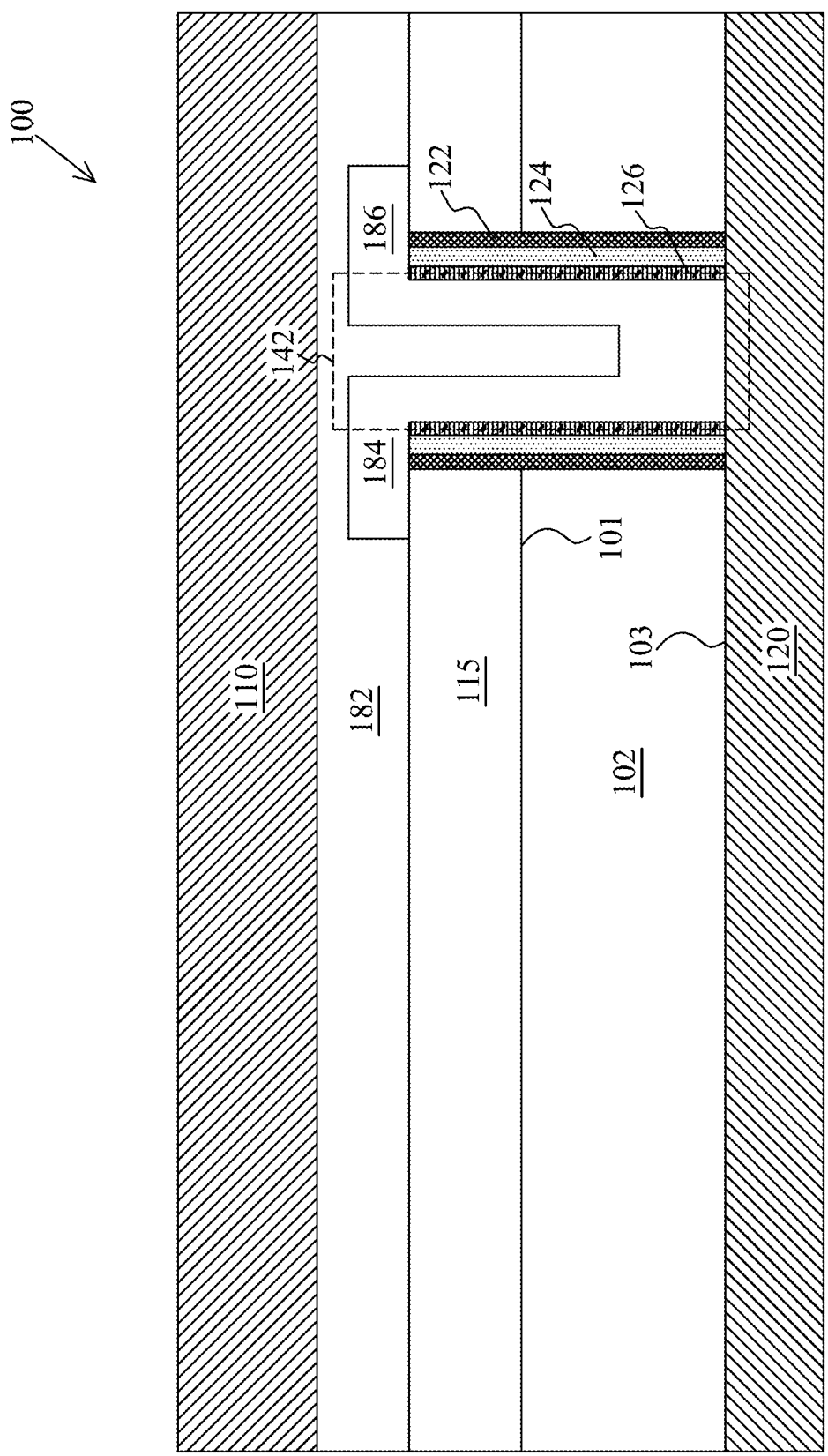
FIG. 1 illustrates a cross sectional view of a semiconductor device in accordance with an embodiment.

FIG. 1 illustrates a cross sectional view of a semiconductor device in accordance with an embodiment. The semiconductor device 100 is formed in a substrate 102. The substrate 102 has a first side 101 and a second side 103. A first side interconnection structure 110 is formed over the first side 101 of the substrate 102. A second side interconnection structure 120 is formed over the second side 103 of the substrate 102. The details of the first side interconnection structure 110 and the second side interconnection structure 120 will be described below with respect to FIGS. 2-24.

The semiconductor device 100 may comprise a plurality of through vias. For simplicity, only one through via 142 is shown in FIG. 1. The through via 142 may be divided into three portions. The bottom portion is adjacent to the second side 103 of the substrate 102. The sidewall portions are formed along the sidewalls of the through via opening. More particularly, as shown in FIG. 1, the sidewall portions of the through via 142 are coupled between the bottom portion and metal lines 184 and 186 of the first metallization layer respectively.

As shown in FIG. 1, there may be three thin layers 122, 124 and 126 formed between the substrate 102 and the sidewall portions of the through via 142. In accordance with an embodiment, the thin layers 122, 124 and 126 are a liner layer, a barrier layer and a seed layer respectively. The detailed fabrication process of these three thin layers will be described below with respect to FIGS. 4-6.

The through via 142 may further comprise a middle portion formed between two sidewall portions. The middle portion may comprise a dielectric material. More particularly, the material of the middle portion may be the same as the material of the first inter-metal dielectric layer 182. The detailed formation of the through via 142 will be described below with respect to FIGS. 9-11.

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

An interlayer dielectric layer 115 is formed on top of the substrate 102. The interlayer dielectric layer 115 may be formed, for example, of a low-K dielectric material, such as silicon oxide. The interlayer dielectric layer 115 may be formed by any suitable method known in the art, such as spinning, chemical vapor deposition (CVD) and plasma enhanced chemical vapor deposition (PECVD). It should also be noted that one skilled in the art will recognize while FIG. 1 illustrates a single interlayer dielectric layer, the interlayer dielectric layer 115 may comprise a plurality of dielectric layers.

FIG. 1 further illustrates a first inter-metal dielectric layer 182 formed over the interlayer dielectric layer 115. As shown in FIG. 1, there may be two metal lines 184 and 186 formed in the first inter-metal dielectric layer 182. The through via 142 is coupled to the metal lines 184 and 186. In particular, the metal portions of the through via 142 and the metal lines 184 and 186 may be formed at the same fabrication step. The detailed formation of the metal lines and the through via 142 will be described below with respect to FIGS. 7-10.

It should be noted while FIG. 1 illustrates metal lines 184 and 186 formed in the first inter-metal dielectric layer 182, one person skilled in the art will recognize that more inter-metal dielectric layers and the associated metallization layers may be used to interconnect the electrical circuits in the substrate 102 to each other to form functional circuitry and to further provide an external electrical connection. A fabrication process of the semiconductor device 100 having multiple inter-metal dielectric layers and the associated metallization layers will be described below with respect to FIGS. 2 to 24.

FIGS. 2 to 24 illustrate intermediate steps of fabricating the through via shown in FIG. 1 in accordance with an embodiment. The fabrication process described below is based upon a via-first fabrication process. However, as one having ordinary skill in the art will recognize that the via-first fabrication process described below is merely an exemplary process and is not meant to limit the various embodiments. Other via fabrication processes such as via-middle and via-last fabrication techniques may alternatively be used. In sum, any suitable via fabrication process may be used, and all such processes are fully intended to be included within the scope of the embodiments discussed herein.

Figure 2:
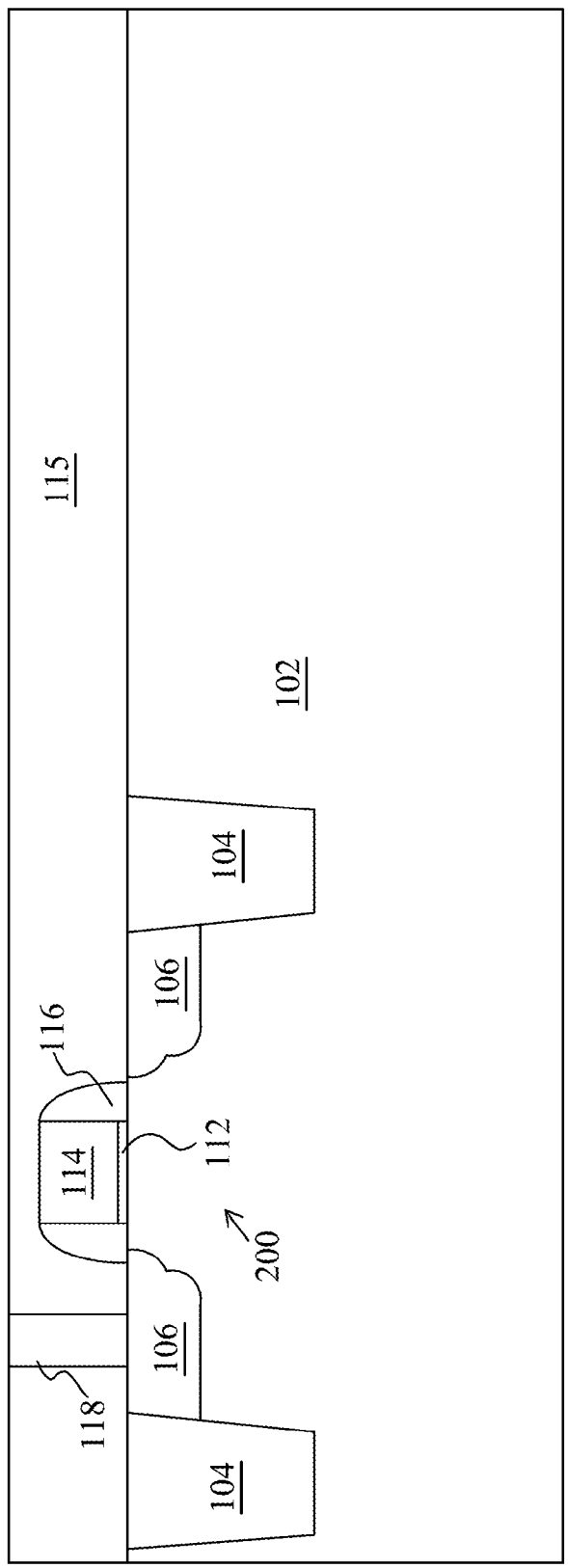
FIG. 2 illustrates a semiconductor device after a plurality of electrical circuits have been formed in the substrate in accordance with an embodiment.

FIG. 2 illustrates a semiconductor device after a variety of electrical circuits have been formed in the substrate in accordance with an embodiment. The substrate 102 may comprise a variety of electrical circuits such as metal oxide semiconductor (MOS) transistors (e.g., MOS transistor 200) and the associated contact plugs (e.g., contact plug 118). For simplicity, only a single MOS transistor and a single contact plug are presented to illustrate the innovative aspects of various embodiments.

The MOS transistor 200 is formed in the substrate 102. The MOS transistor 200 includes two drain/source regions 106. As shown in FIG. 2, the drain/source regions 106 are formed on opposite sides of a gate stack. The gate stack includes a gate dielectric layer 112 formed over the substrate 102, a gate electrode formed over the gate dielectric layer 112 and gate spacers 116. As shown in FIG. 2, there may be two isolation regions 104 formed on opposite sides of the MOS transistor 200.

The isolation regions 104 may be shallow trench isolation (STI) regions, and may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a CMP process may be applied to the top surface so that the excess dielectric material may be removed as a result.

The gate dielectric 112 may be a dielectric material such as silicon oxide, silicon oxynitride, silicon nitride, an oxide, a nitrogen-containing oxide, a combination thereof and/or the like. The gate dielectric 112 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric 112 comprises an oxide layer, the gate dielectrics 112 may be formed by a PECVD process using tetraethoxysilane (TEOS) and oxygen as a precursor. In accordance with an embodiment, the gate dielectric 112 may be of a thickness in a range from about 8 Å to about 200 Å.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is poly-silicon, the gate electrode 114 may be formed by depositing doped or undoped poly-silicon by low-pressure chemical vapor deposition (LPCVD) to a thickness in the range of about 400 Å to about 2,400 Å.

The spacers 116 may be formed by blanket depositing one or more spacer layers (not shown) over the gate electrode 114 and the substrate 102. The spacer layers 116 may comprise suitable dielectric materials such as SiN, oxynitride, SiC, SiON, oxide and/or the like. The spacer layers 116 may be formed by commonly used techniques such as CVD, PECVD, sputter and/or the like.

The drain/source regions 106 may be formed in the substrate 102 on opposing sides of the gate dielectric 112. In an embodiment in which the substrate 102 is an n-type substrate, the drain/source regions 106 may be formed by implanting appropriate p-type dopants such as boron, gallium, indium and/or the like. Alternatively, in an embodiment in which the substrate 102 is a p-type substrate, the drain/source regions 106 may be formed by implanting appropriate n-type dopants such as phosphorous, arsenic and/or the like.

As shown in FIG. 2, the interlayer dielectric layer 115 is formed over the substrate 102. There may be a contact plug 118 formed in the interlayer dielectric layer 115. The contact plug 118 is formed through the interlayer dielectric layer 115 to provide an electrical connection between the MOS transistor 200 and the interconnect structure (not shown but illustrated in FIG. 24) formed over the interlayer dielectric layer 115.

The contact plug 118 may be formed by using photolithography techniques to deposit and pattern a photoresist material on the interlayer dielectric layer 115. A portion of the photoresist is exposed according to the location and shape of the contact plug 118. An etching process, such as an anisotropic dry etch process, may be used to create an opening in the interlayer dielectric layer 115.

A conductive liner may be deposited prior to filling the contact plug hole. The conductive liner is preferably conformal, and may comprise a single layer of Ta, TaN, WN, WSi, TiN, Ru and combinations thereof. The conductive liner may be typically used as a barrier layer for preventing the conductive material such as copper from diffusing into the underlying substrate 102. The conductive liner may be deposited by using suitable deposition process such as CVD, PVD, Atomic Layer Deposition (ALD) and/or the like.

A conductive material is then filled in the opening. The conductive material may be deposited by using CVD, PVD or ALD. The conductive material is deposited over the conductive liner to fill the contact plug opening. Excess portions of the conductive material are removed from the top surface of the interlayer dielectric layer 115 by using a planarization process such as CMP. The conductive material may be copper, tungsten, aluminum, silver, titanium, titanium nitride, tantalum and combinations thereof and/or the like.

Figure 3:
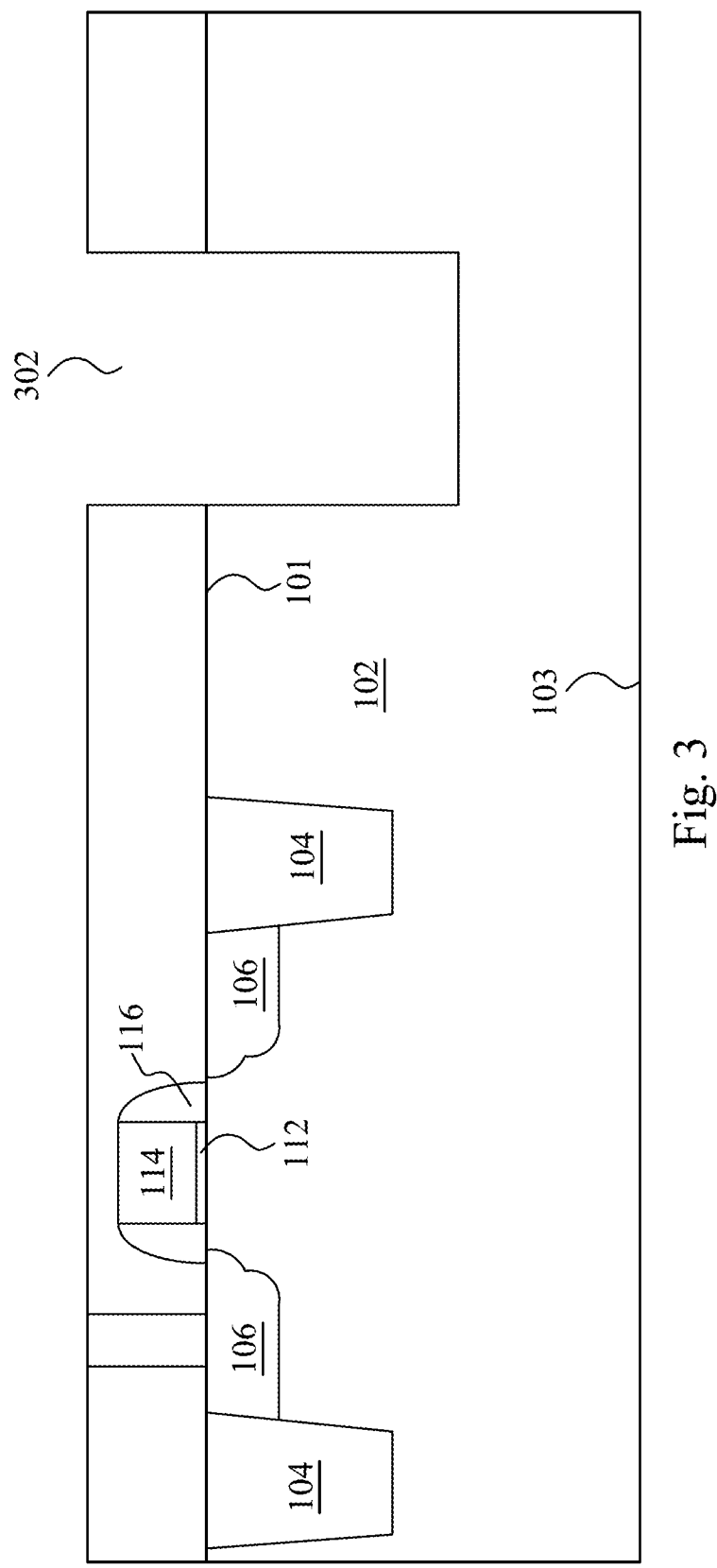
FIG. 3 illustrates a cross sectional view of the semiconductor device shown in FIG. 2 after an opening is formed the substrate in accordance with an embodiment.

FIG. 3 illustrates a cross sectional view of the semiconductor device shown in FIG. 2 after an opening is formed the substrate in accordance with an embodiment. A through via opening 302 may be formed into the first side 101 of the substrate 102. The through via opening 302 may be formed by applying and developing a suitable photoresist layer (not shown), and removing the portion of the substrate 102 that is exposed to the desired depth. The through via opening 302 may be formed so as to extend deeper into the substrate 102 than the MOS transistor 200 formed within and/or on the substrate 102.

Figure 4:
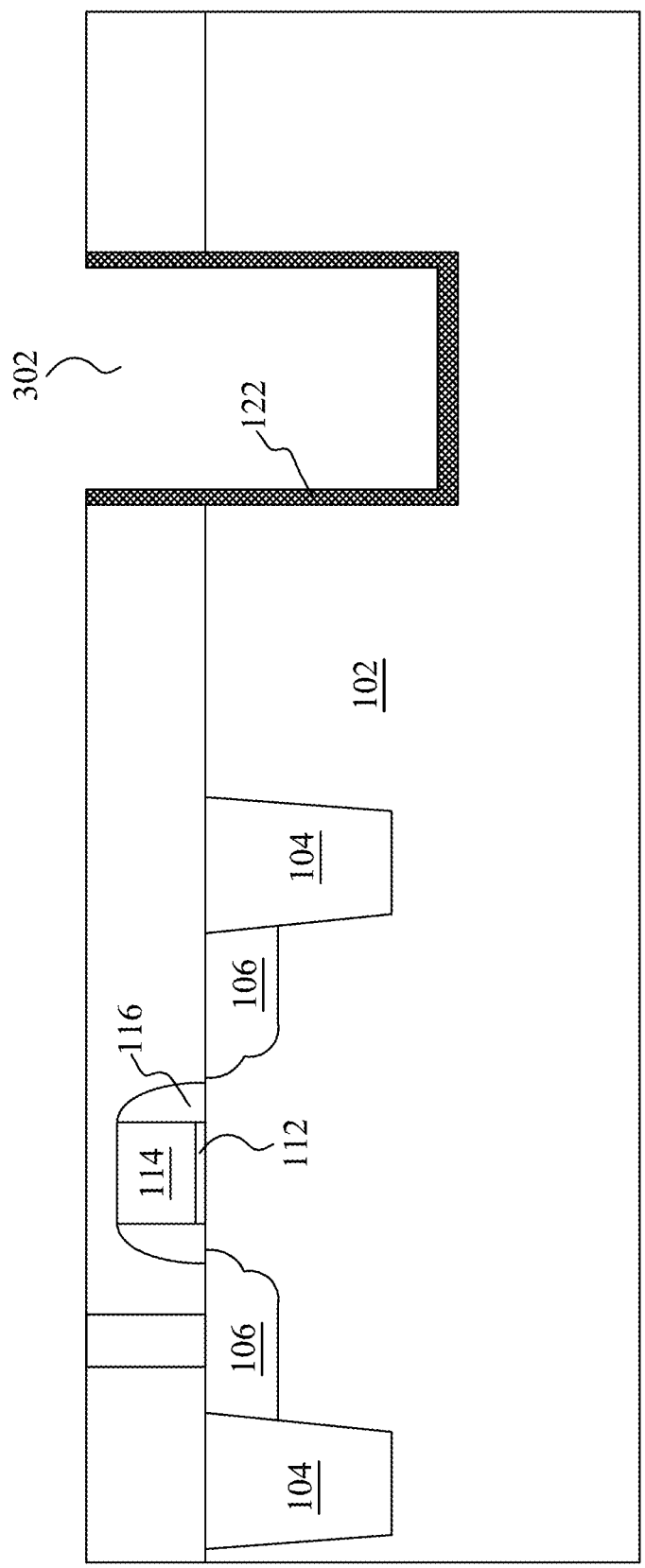
FIG. 4 illustrates a cross sectional view of the semiconductor device shown in FIG. 3 after a liner layer is formed on the sidewalls and the bottom of the opening in accordance with an embodiment.

FIG. 4 illustrates a cross sectional view of the semiconductor device shown in FIG. 3 after a liner layer is formed on the sidewalls and the bottom of the opening in accordance with an embodiment. Once the through via opening 302 has been formed within the substrate 102, the sidewalls and the bottom of the through via opening 302 may be deposited with a liner layer 122. The liner layer 122 may be formed of suitable dielectric materials such as TEOS, silicon nitride, oxide, silicon oxynitride, low-K dielectric materials, high-K dielectric materials and/or the like.

The liner layer 122 may be formed using suitable fabrication processes such as a PECVD process, although other suitable processes, such as PVD, a thermal process and/or the like, may alternatively be used. Additionally, the liner layer 122 may be formed to a thickness in a range from about 0.1 µm to about 5 µm.

Figure 5:
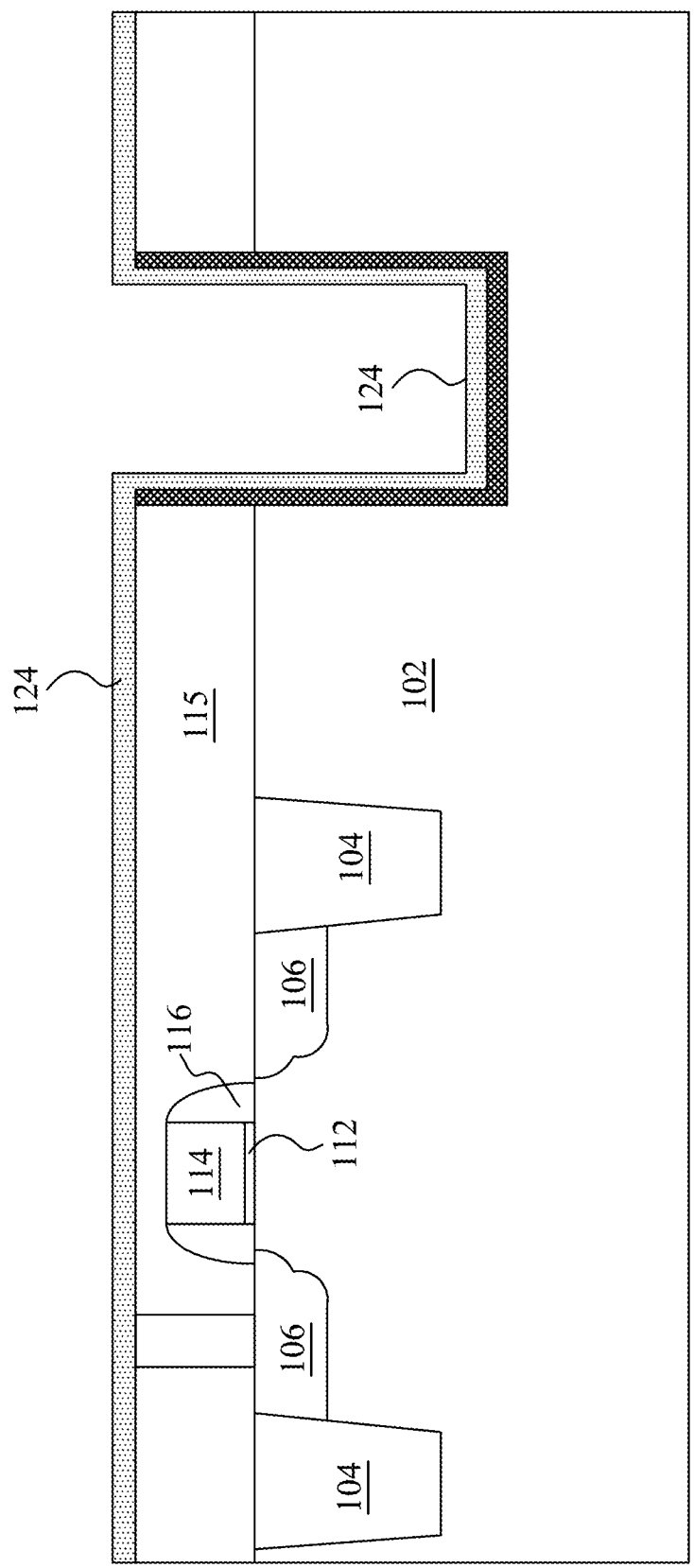
FIG. 5 illustrates a cross sectional view of the semiconductor device shown in FIG. 4 after a barrier layer is formed over the liner layer in accordance with an embodiment.

FIG. 5 illustrates a cross sectional view of the semiconductor device shown in FIG. 4 after a barrier layer is formed over the liner layer in accordance with an embodiment. The barrier layer 124 may be deposited on the liner layer 122 as well as the top surface of the interlayer dielectric layer 115. The barrier layer 124 may be formed of titanium, titanium nitride, tantalum, tantalum nitride, and combinations thereof and/or the like. The barrier layer 124 may be formed using suitable fabrication techniques such as ALD, PECVD, plasma enhanced physical vapor deposition (PEPVD) and/or the like.

Figure 6:
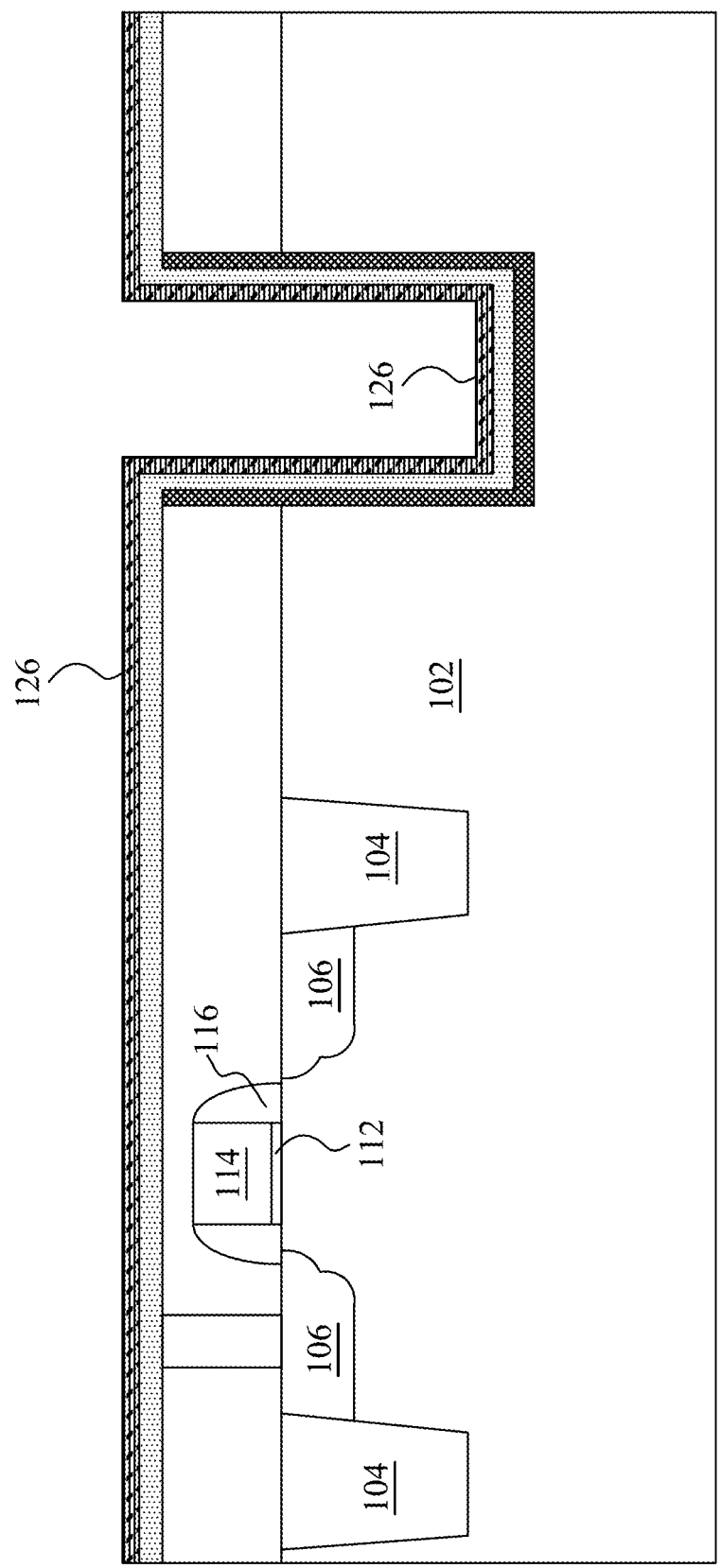
FIG. 6 illustrates a cross sectional view of the semiconductor device shown in FIG. 5 after a seed layer is formed over the barrier layer in accordance with an embodiment.

FIG. 6 illustrates a cross sectional view of the semiconductor device shown in FIG. 5 after a seed layer is formed over the barrier layer in accordance with an embodiment. The seed layer 126 may be may be formed of copper, nickel, gold, any combination thereof and/or the like. The seed layer 126 may be formed by suitable deposition techniques such as PVD, CVD and/or the like. The seed layer 126 may have a thickness of between about 50 Å and about 1,000 Å.

In addition, the seed layer 126 may be alloyed with a material that improves the adhesive properties of the seed layer 126 so that it can act as an adhesion layer. For example, the seed layer 126 may be alloyed with a material such as manganese or aluminum, which will migrate to the interface between the seed layer 126 and the barrier layer 124 and will enhance the adhesion between these two layers. The alloying material may be introduced during formation of the seed layer 126. The alloying material may comprise no more than about 10% of the seed layer.

Figure 7:
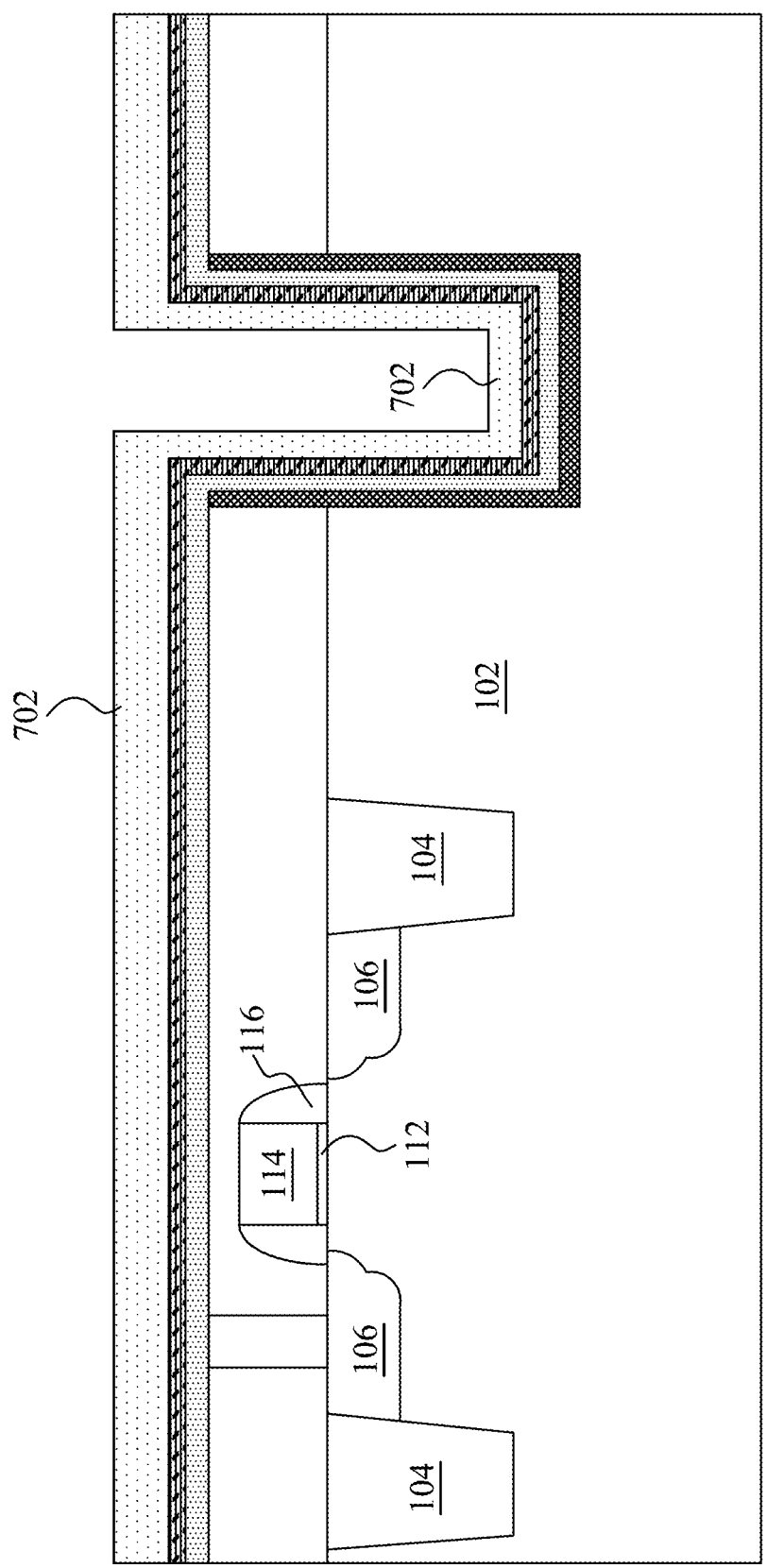
FIG. 7 illustrates a cross sectional view of the semiconductor device shown in FIG. 6 after a dielectric layer is formed over the seed layer in accordance with an embodiment.

FIG. 7 illustrates a cross sectional view of the semiconductor device shown in FIG. 6 after a dielectric layer is formed over the seed layer in accordance with an embodiment. A dielectric layer 702 is formed on top of the seed layer 126. The dielectric layer 702 may be formed of either photoresist materials or non-photoresist materials. In accordance with an embodiment, the dielectric layer 702 may be formed of general photoresist materials. The dielectric layer 702 may be formed by suitable fabrication techniques such as spin coating and/or the like.

Figure 8:
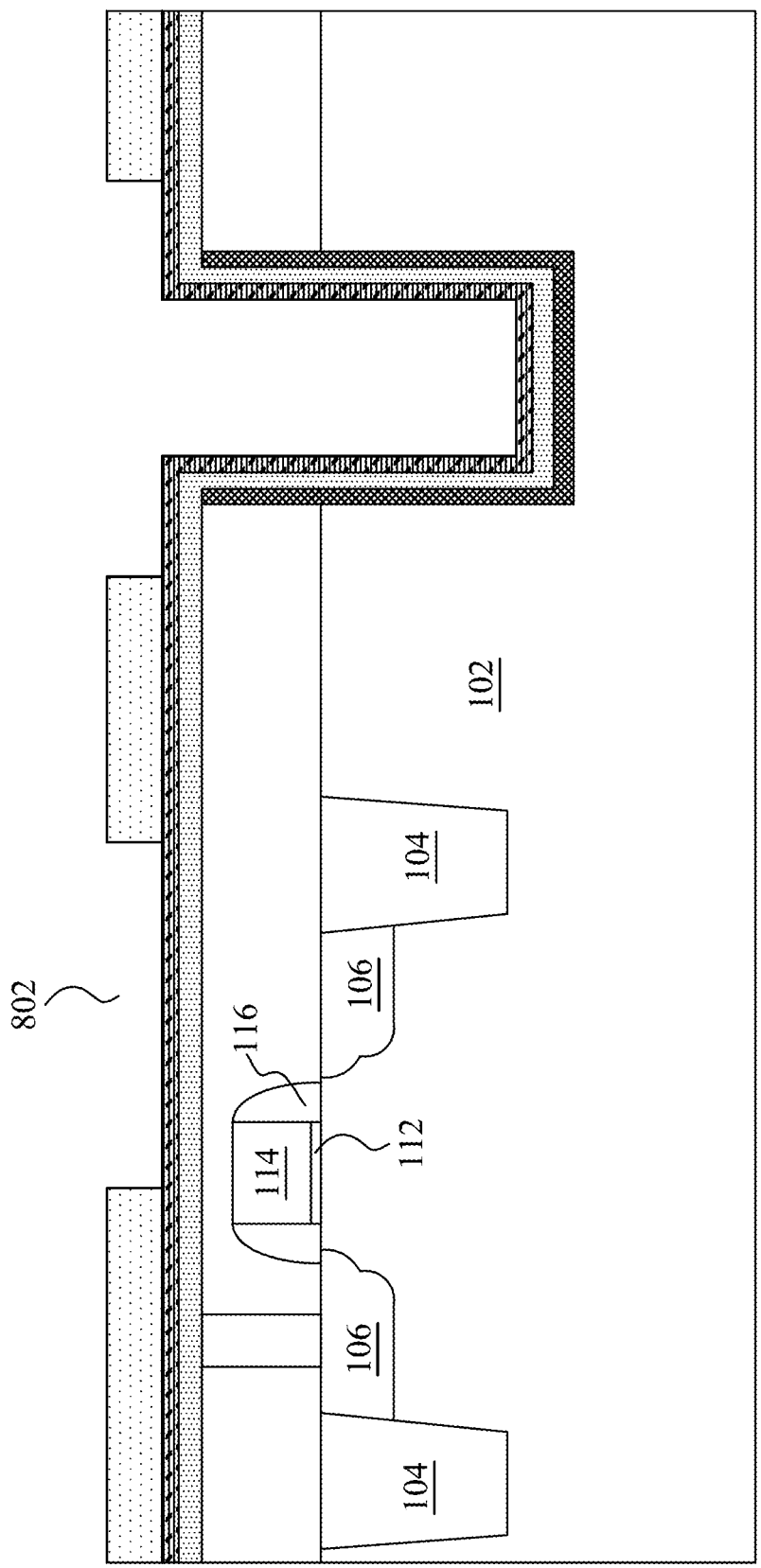
FIG. 8 illustrates a cross sectional view of the semiconductor device shown in FIG. 7 after a patterning process is applied to the dielectric layer in accordance with an embodiment.

FIG. 8 illustrates a cross sectional view of the semiconductor device shown in FIG. 7 after a patterning process is applied to the dielectric layer in accordance with an embodiment. In consideration of the location of metal lines and the through via, selective areas of the dielectric layer 702 are exposed to light. As a result, the photoresist material in the opening 302 is removed and a variety of openings (e.g., opening 802) are formed on top of the seed layer 126. The formation of the openings such as opening 802 in the dielectric layer 702 involves lithography operations, which are well known, and hence are not discussed in further detail herein.

Figure 9:
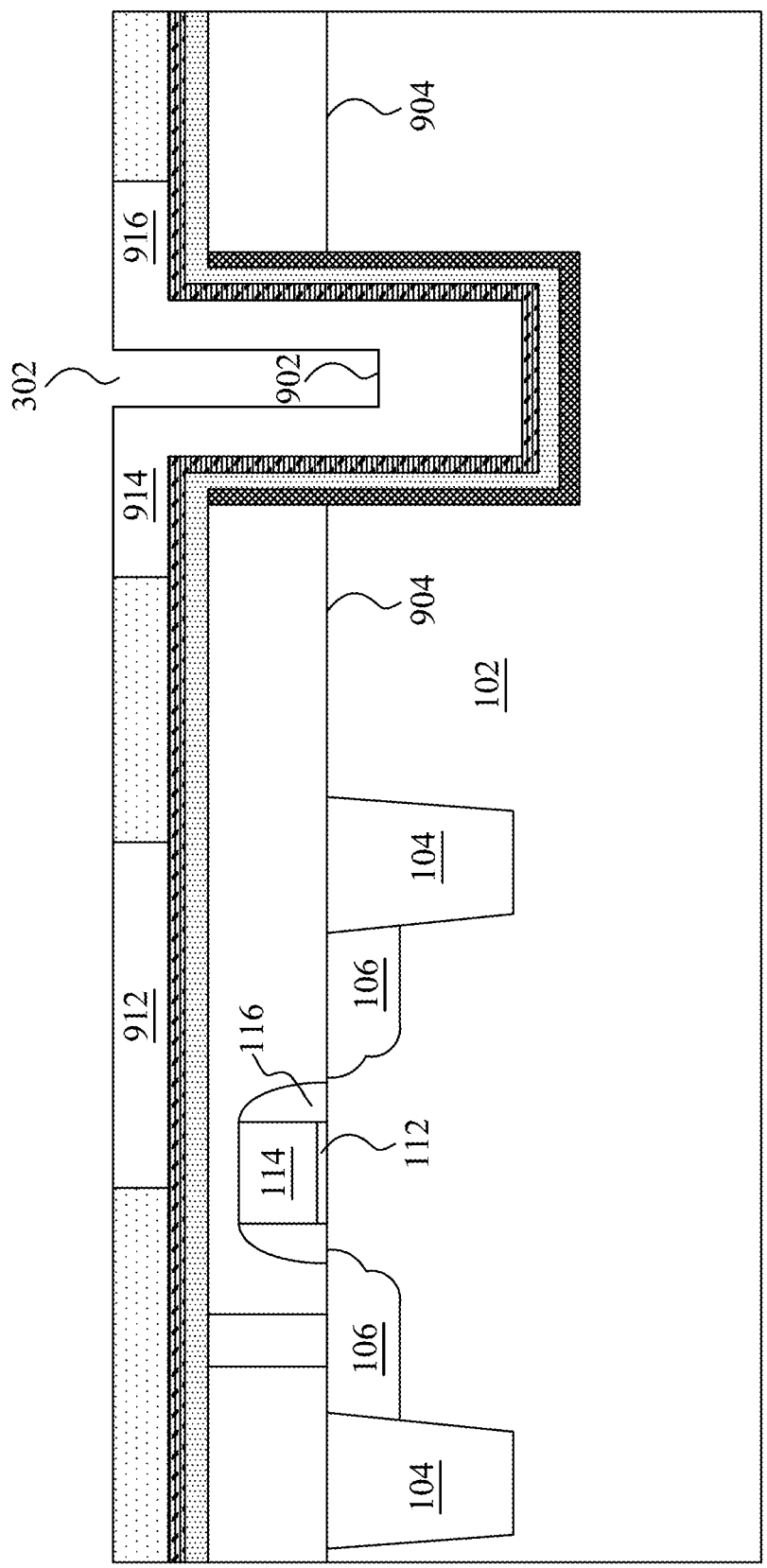
FIG. 9 illustrates a cross sectional view of the semiconductor device shown in FIG. 8 after a conductive material is filled in the opening in accordance with an embodiment.

FIG. 9 illustrates a cross sectional view of the semiconductor device shown in FIG. 8 after a conductive material is filled in the openings in accordance with an embodiment. The through via opening as well as the openings (e.g., opening 802) on top of the seed layer 126 may be filled with a conductive material. The conductive material may comprise copper, although other suitable materials such as aluminum, alloys, tungsten, silver, doped polysilicon, combinations thereof, and/or the like, may alternatively be utilized.

As shown in FIG. 9, the through via opening 302 is partially filled with the conductive material. The conductive material may be filled in the opening 302 through an electroplating process. The electroplating process is controlled so that the top surface 902 of the bottom portion of the through via is lower than the top surface 904 of the substrate 102. FIG. 9 further illustrates the metal lines 912, 914 and 916 of the first metallization layer are formed at the same fabrication step as the through via.

In accordance with an embodiment, the metal lines 912, 914 and 916 are of a thickness in a range from about 0.5 um to about 10 um. The sidewalls of the through via may be of a thickness similar to that of the metal lines 912, 914 and 916. The bottom portion of the through via may be of a thickness about 10 to 50 times greater than the thickness of the metal lines 912, 914 and 916. It should be noted the thickness ratio between the bottom portion of the through via and the metal lines may be adjustable by controlling the electroplating process.

One advantageous feature of having the metal lines of the first metallization layer and the metal portions of the through via formed at the same electroplating process is that the total production time of the semiconductor device is reduced. Moreover, the through via is partially filled with the conductive material. Such partially filled structure helps to reduce the time of the electroplating process. In addition, the planarization process commonly used in a conventional fabrication process may be saved. As a result, the cost as well as the production time of the semiconductor device is improved.

Another advantageous feature of the fabrication process described above with respect to FIG. 9 is that partially filled structure helps to resolve some common issues of the conventional structure. For example, in a via-first fabrication process, the through via is formed before the interconnect structure. During the back-end-of-line (BEOL) process, the thermal stress of the BEOL process may cause reliability problems such as copper popping and the like. By employing the partially filled structure shown in FIG. 9, the copper popping problem may not lead to a reliability issue because the through via is not fully filled with copper. The dielectric material (not shown) filled in the through via may function as a stress buffer to prevent the copper of the through via from popping out.

Figure 10:
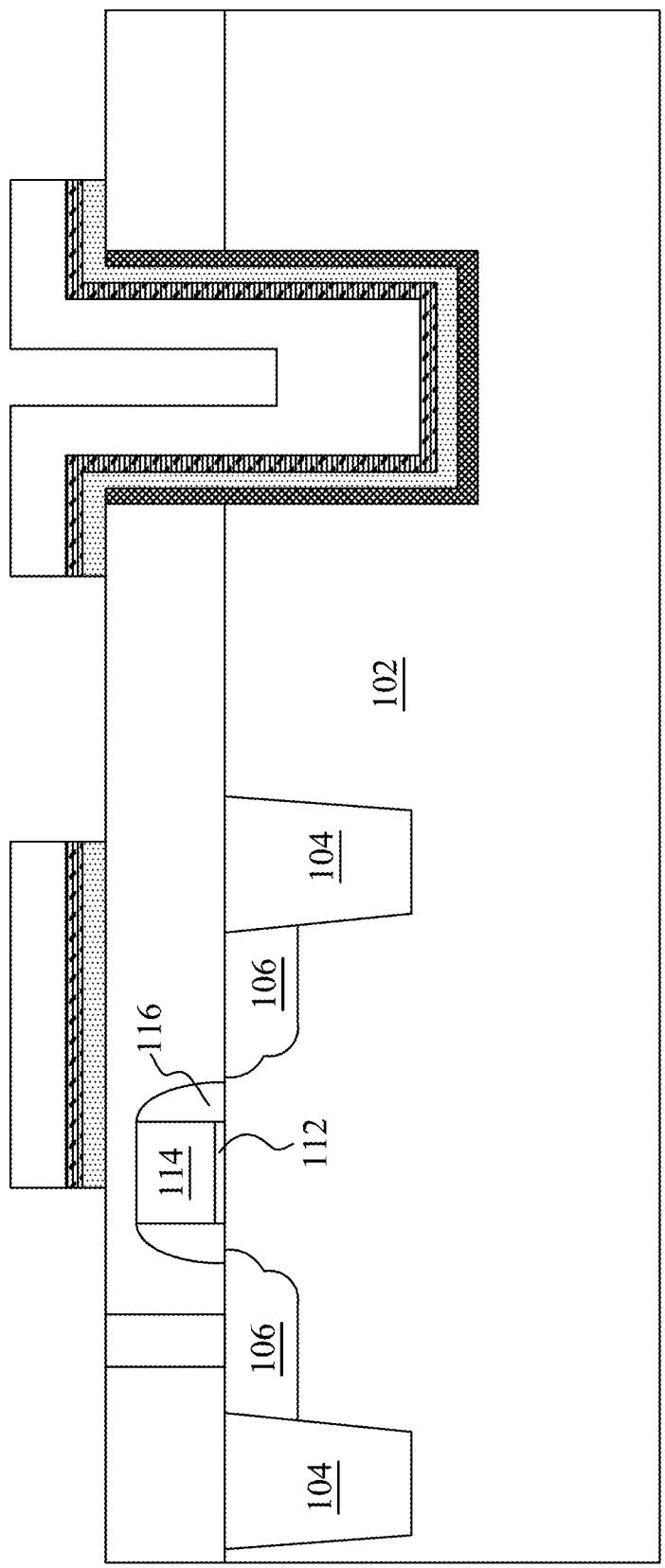
FIG. 10 illustrates a cross sectional view of the semiconductor device shown in FIG. 9 after the remaining photoresist layer has been removed in accordance with an embodiment.

FIG. 10 illustrates a cross sectional view of the semiconductor device shown in FIG. 9 after the remaining photoresist layer has been removed in accordance with an embodiment. The remaining photoresist layer shown in FIG. 9 may be removed by using suitable photoresist stripping techniques such as chemical solvent cleaning, plasma ashing, dry stripping and/or the like. The photoresist stripping techniques are well known and hence are not discussed in further detail herein to avoid repetition.

In addition, the barrier layer and seed layer underneath the remaining photoresist layer (shown in FIG. 9) may be removed by using a suitable etching process such as wet-etching, dry-etching and/or the like. The detailed operations of either the dry etching process or the wet etching process are well known in the art, and hence are not discussed herein to avoid repetition.

Figure 11:
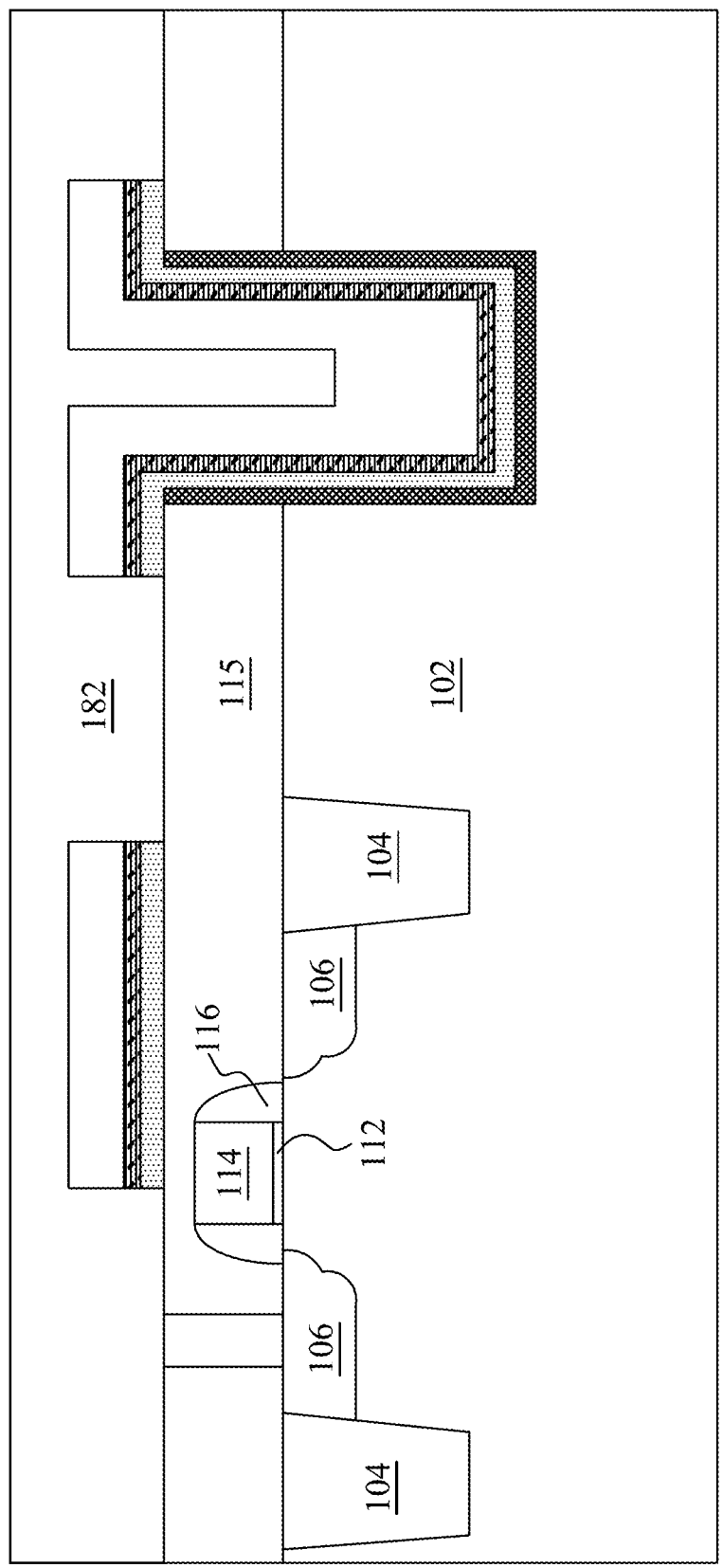
FIG. 11 illustrates a cross sectional view of the semiconductor device shown in FIG. 10 after an inter-metal dielectric layer is deposited in accordance with an embodiment.

FIG. 11 illustrates a cross sectional view of the semiconductor device shown in FIG. 10 after an inter-metal dielectric layer is deposited in accordance with an embodiment. The inter-metal dielectric layer 182 is formed over the interlayer dielectric layer 115. More particularly, the remaining opening (shown in FIG. 10) of the through via is filled with the dielectric material through the deposition of the inter-metal dielectric layer 182. The inter-metal dielectric layer 182 may be formed of a low-K dielectric material such as fluorosilicate glass (FSG) and/or the like. The inter-metal dielectric layer 182 may be formed by suitable deposition techniques such as such as spin coating and/or the like.

One advantage feature of a through via filled with a combination of a conductive material and a dielectric material is that the dielectric middle portion may function as a stress buffer. Such a stress buffer helps to prevent the through via from being damaged by thermal and mechanical stresses during the subsequent fabrication steps.

Figure 12:
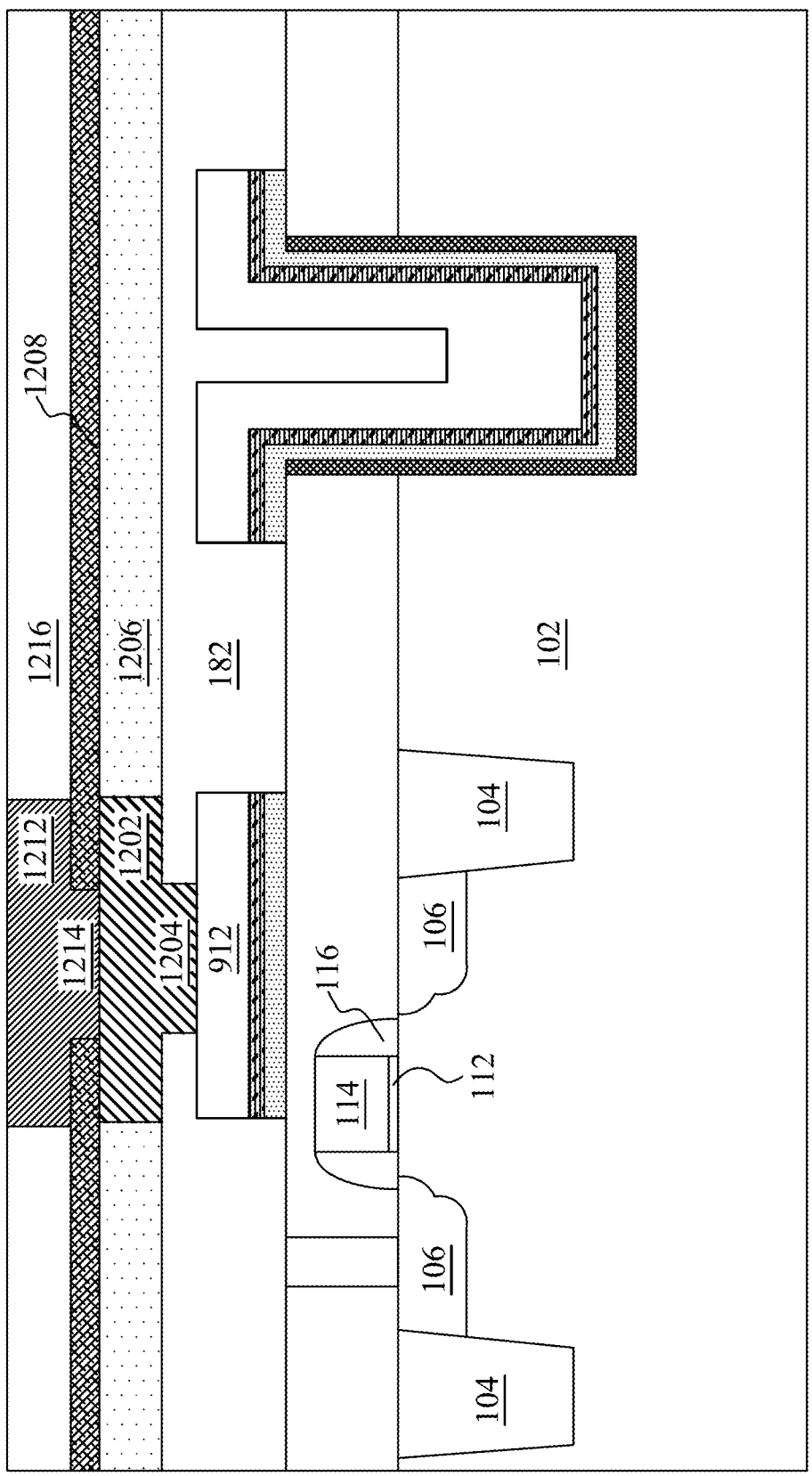
FIG. 12 illustrates a cross sectional view of the semiconductor device shown in FIG. 11 after two additional metallization layers are formed over the first metallization layer in accordance with an embodiment.

FIG. 12 illustrates a cross sectional view of the semiconductor device shown in FIG. 11 after two additional metallization layers are formed over the first metallization layer in accordance with an embodiment. As shown in FIG. 12, two additional metallization layers are formed over the first metallization layer. While FIG. 12 shows two metallization layers formed over the first metallization layer, one skilled in the art will recognize that more inter-metal dielectric layers (not shown) and the associated metal lines and plugs (not shown) may be formed between the metallization layers (e.g., layer 1206 and 1216) shown in FIG. 12. In particular, the layers between the metallization layers shown in FIG. 12 may be formed by alternating layers of dielectric (e.g., extremely low-k dielectric material) and conductive materials (e.g., copper).

It should further be noted that the metallization layers shown in FIG. 12 are formed by a dual damascene process, although other suitable techniques such as deposition, single damascene may alternatively be used. The dual damascene process is well known in the art, and hence is not discussed herein.

The second metal line 1202 and the second plug 1204 are formed by a dual damascene process. The second metal line 1202 is embedded in a second inter-metal dielectric layer 1206, which is similar to the first inter-metal dielectric layer 182. The second plug 1204 is formed in the first inter-metal dielectric layer 182. More particularly, the second metal line 1202 and the metal line 912 are coupled to each other through the second plug 1204. The second metal line 1202 and the plug 1204 may be formed of metal materials such as copper, copper alloys, aluminum, silver, gold, any combinations thereof and/or the like. The third metal line 1212 and the third plug 1214 are formed in dielectric layers 1216 and 1208 respectively. The third metal line 1212 and the third plug 1214 are similar to the second metal line 1202 and the second plug 1204, and hence are not discussed to avoid repetition.

Figure 13:
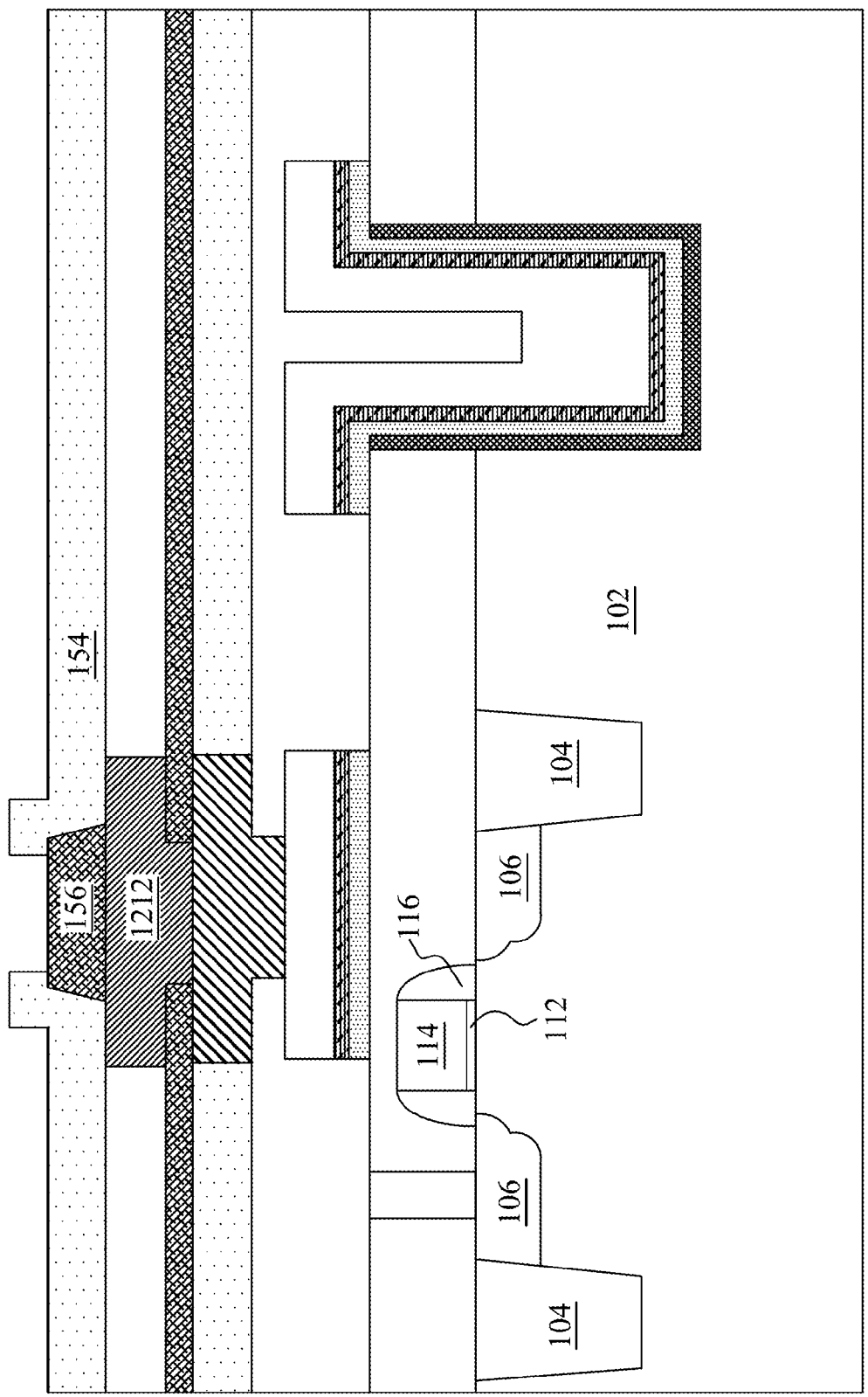
FIG. 13 illustrates a cross sectional view of the semiconductor device shown in FIG. 12 after a passivation layer is formed on the top of the inter-metal dielectric layer in accordance with an embodiment.

FIG. 13 illustrates a cross sectional view of the semiconductor device shown in FIG. 12 after a passivation layer is formed on the top of the inter-metal dielectric layer in accordance with an embodiment. The passivation layer 154 is formed of non-organic materials such as un-doped silicate glass, silicon nitride, silicon oxide, silicon oxynitride, boron-doped silicon oxide, phosphorus-doped silicon oxide and/or the like. Alternatively, the passivation layer 154 may be formed of low-k dielectric such as carbon doped oxide and/or the like. In addition, extremely low-k (ELK) dielectrics such as porous carbon doped silicon dioxide can be employed to form the passivation layer 154. The passivation layer 154 may be formed through any suitable techniques such as CVD.

As shown in FIG. 13, there may be an opening formed in the passivation layer 154. The opening is used to accommodate a metal pad 156. As shown in FIG. 13, the metal pad 156 is embedded in the passivation layer 154. In particular, the metal pad 156 provides a conductive channel between the metal lines (e.g., metal line 1212) and a post passivation interconnect structure (not shown but illustrate in FIG. 24). The metal pad 156 may be made of metallic materials such as copper, copper alloys, aluminum, silver, gold and any combinations thereof, and/or multi-layers thereof. The metal pad 156 may be formed by suitable techniques such as CVD. Alternatively, the metal pad 156 may be formed by sputtering, electroplating and/or the like.

Figure 14:
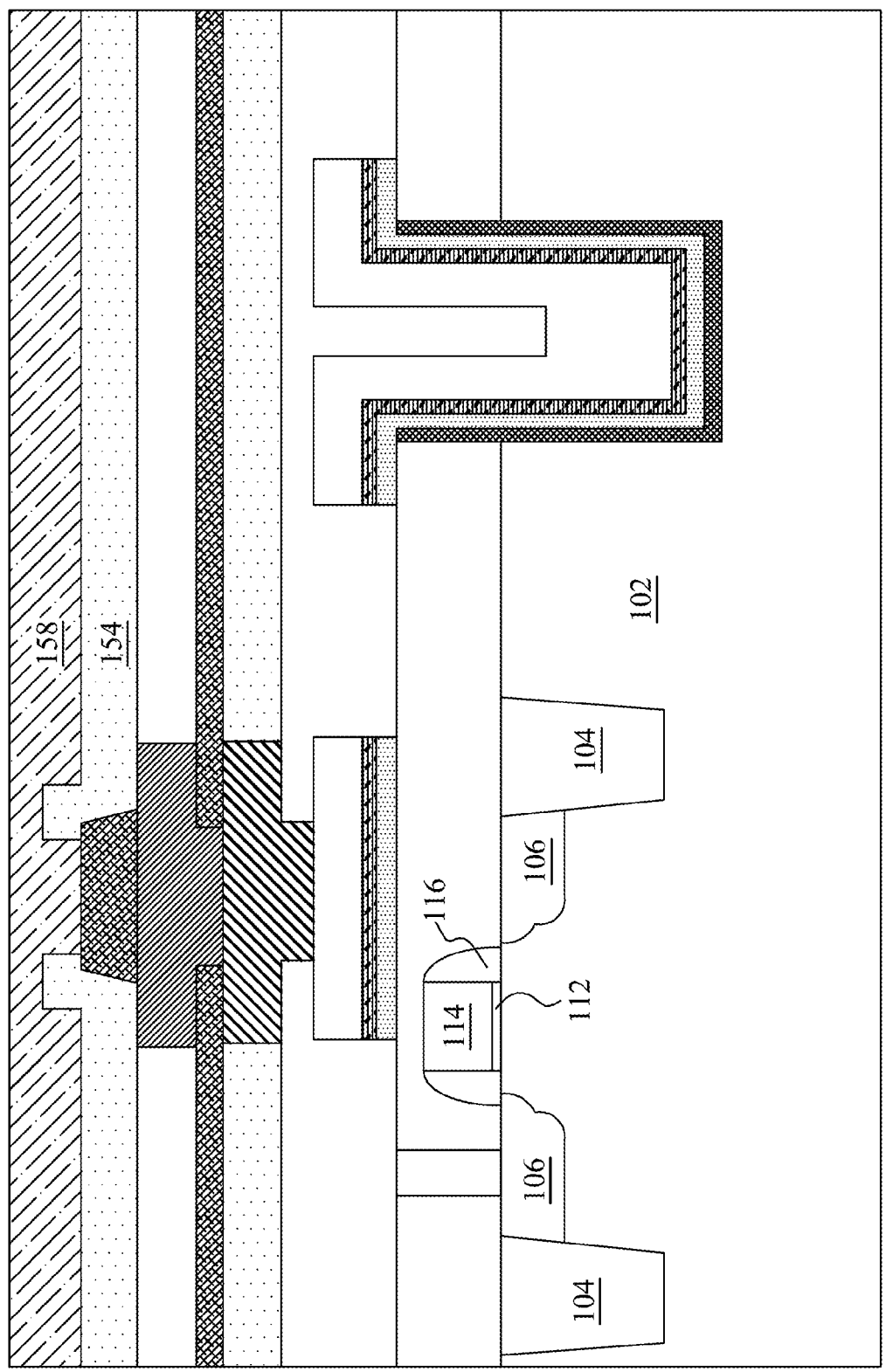
FIG. 14 illustrates a cross sectional view of the semiconductor device shown in FIG. 13 after a first polymer layer is formed on the top of the passivation layer in accordance with an embodiment.

FIG. 14 illustrates a cross sectional view of the semiconductor device shown in FIG. 13 after a first polymer layer is formed on the top of the passivation layer in accordance with an embodiment. The first polymer layer 158 is formed on top of the passivation layer 154. The first polymer layer 158 may be made of polymer materials such as epoxy, polyimide, polybenzoxazole (PBO), silicone, benzocyclobutene (BCB), molding compounds and/or the like. In accordance with an embodiment, the first polymer layer 158 may be formed of PBO. The first polymer layer 158 may be made by suitable deposition methods known in the art such as spin coating.

Figure 15:
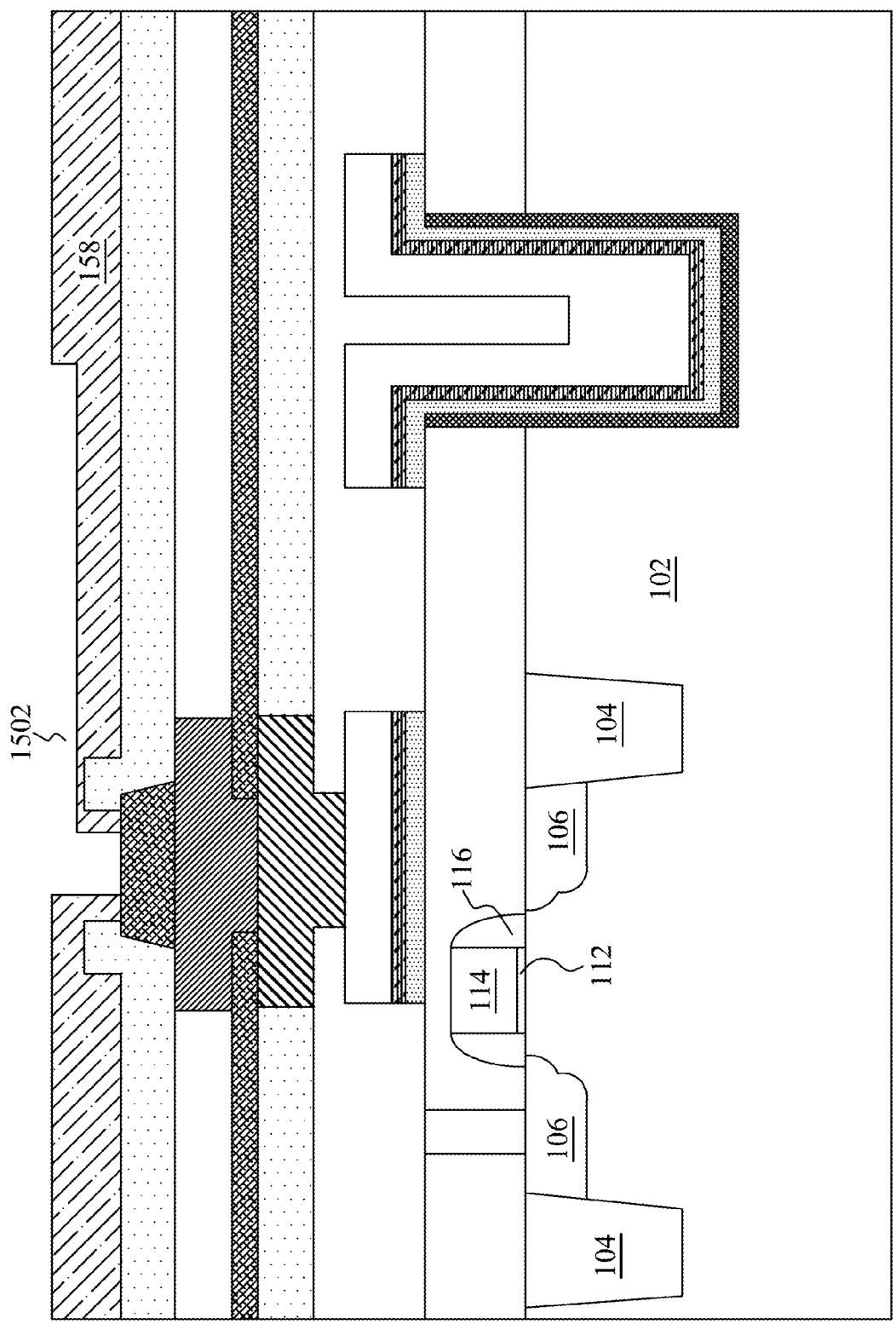
FIG. 15 illustrates a cross sectional view of the semiconductor device shown in FIG. 14 after a patterning process is applied to the surface of the first polymer layer in accordance with an embodiment.

FIG. 15 illustrates a cross sectional view of the semiconductor device shown in FIG. 14 after a patterning process is applied to the surface of the first polymer layer in accordance with an embodiment. The patterning process may be implemented by using suitable patterning techniques such as an etching process, a laser ablation process and/or the like. According to the shape and location of a redistribution line, an etching process or a laser beam (not shown) may be applied to the top surface of the first polymer layer 158. As a result, a portion of the first polymer layer 158 is removed to form an opening 1502.

Figure 16:
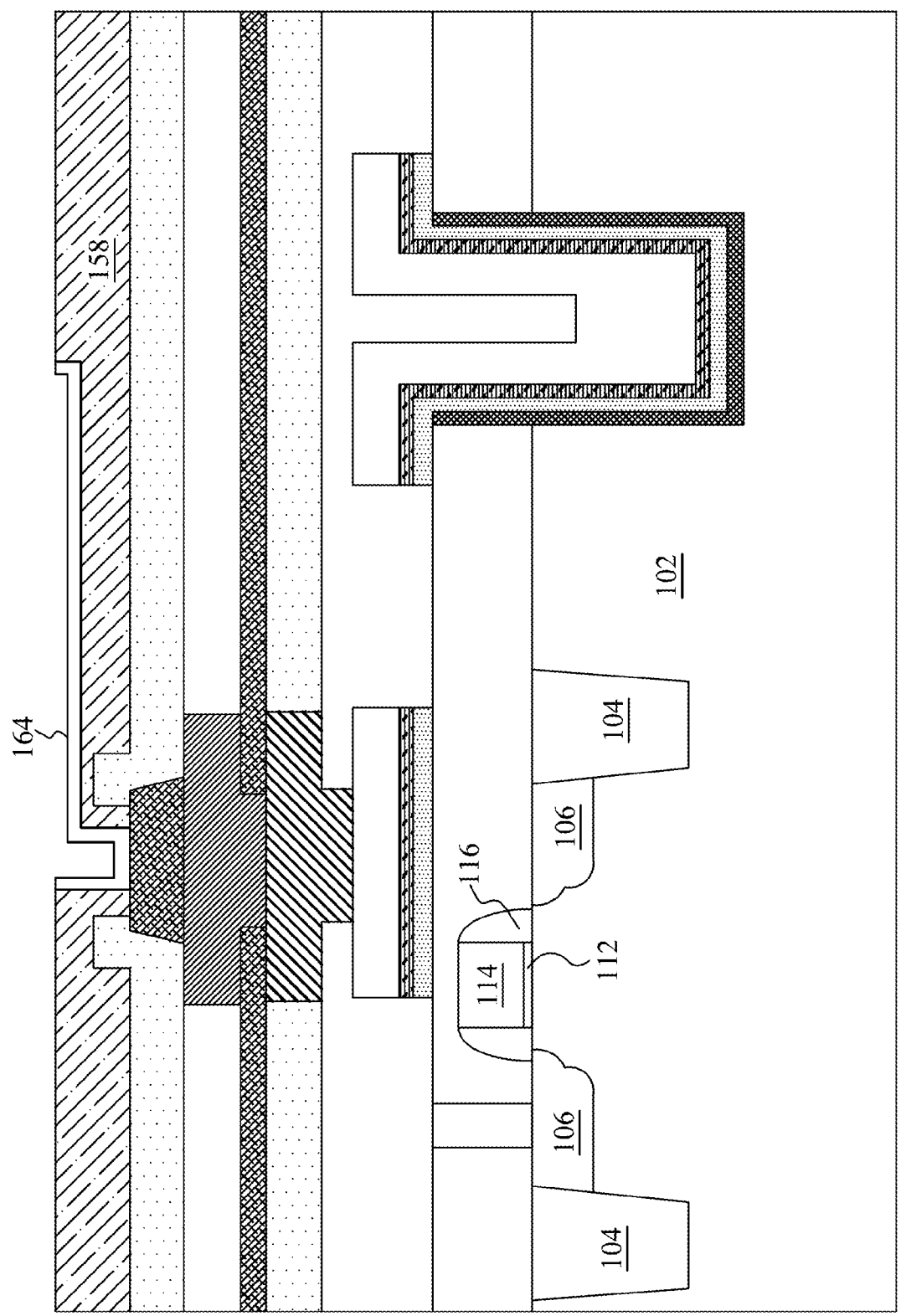
FIG. 16 illustrates a cross sectional view of the semiconductor device shown in FIG. 15 after a seed layer is formed on top of the first polymer layer in accordance with an embodiment.

FIG. 16 illustrates a cross sectional view of the semiconductor device shown in FIG. 15 after a seed layer is formed on top of the first polymer layer in accordance with an embodiment. The seed layer 164 is formed over the first polymer layer 158. The seed layer 164 may comprise two portions, namely a bottom seed layer (not shown) and an upper seed layer (not shown). The bottom seed layer may be a titanium layer, a titanium nitride layer, a tantalum layer, a tantalum nitride layer and/or the like. The upper seed layer may be formed of copper, copper alloys and/or the like. In accordance with an embodiment, the seed layer 164 may be formed using any suitable techniques such as CVD, PVD and/or the like.

Figure 17:
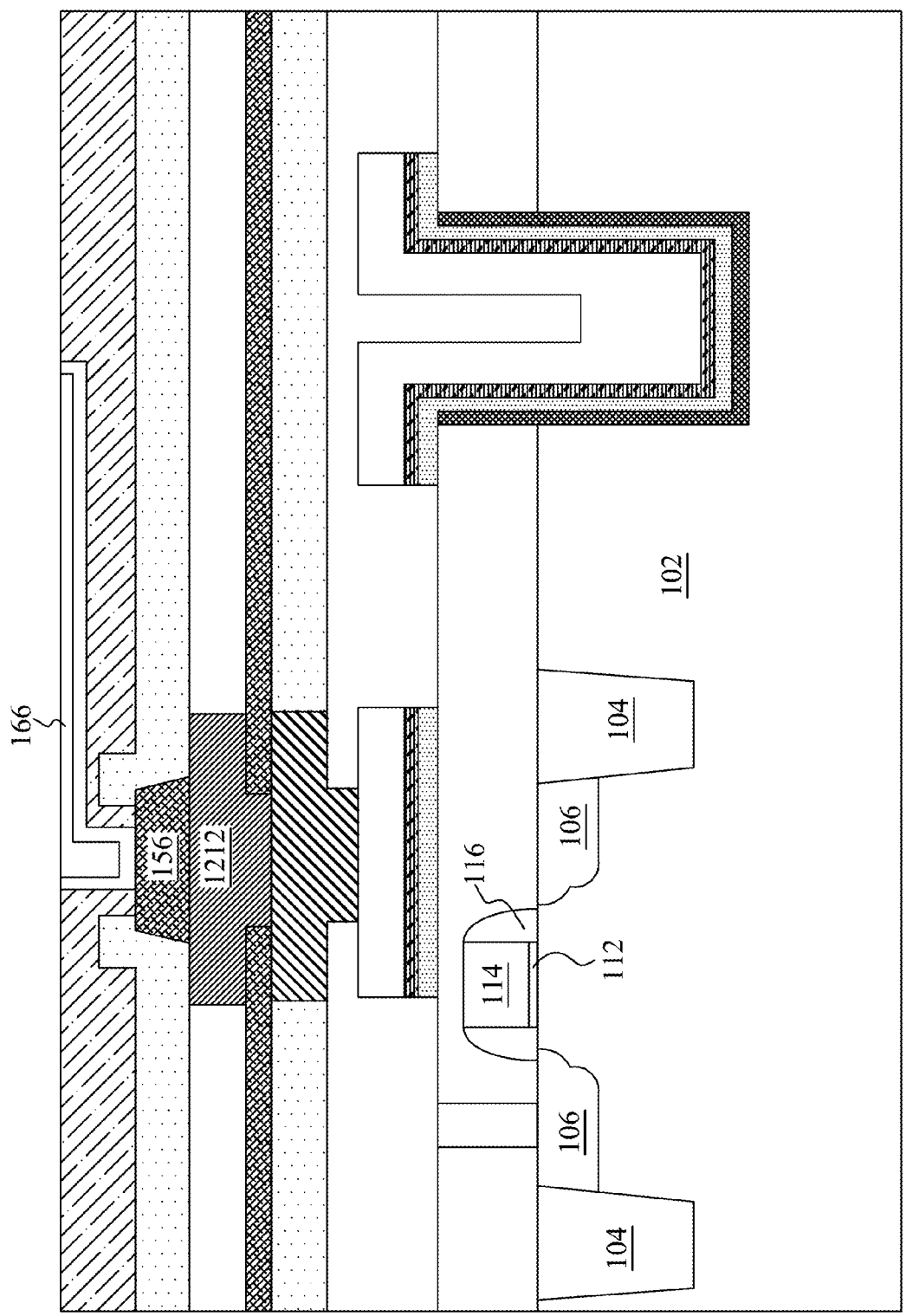
FIG. 17 illustrates a cross sectional view of the semiconductor device shown in FIG. 5 after a redistribution line is formed on top of the seed layer in accordance with an embodiment.

FIG. 17 illustrates a cross sectional view of the semiconductor device shown in FIG. 16 after a redistribution line is formed on top of the seed layer in accordance with an embodiment. As shown in FIG. 17, a conductive material may be filled in the opening (e.g., opening 1502 shown in FIG. 15) to form the redistribution line 166. The conductive material may be copper, but can be any suitable conductive materials, such as copper alloys, aluminum, tungsten, silver, any combinations thereof and/or the like. The redistribution line 166 may be formed by suitable techniques such as an electro-less plating process, CVD, electroplating and/or the like.

As shown in FIG. 17, the redistribution line 166 connects the metal pad 156. More particularly, the redistribution line 166 provides a conductive path between the metal lines (e.g., metal line 1212) and the input/output terminal of the semiconductor device (e.g., the bump 176 shown in FIG. 24). The operation principles of redistribution lines are well known in the art, and hence are not discussed in detail herein.

Figure 18:
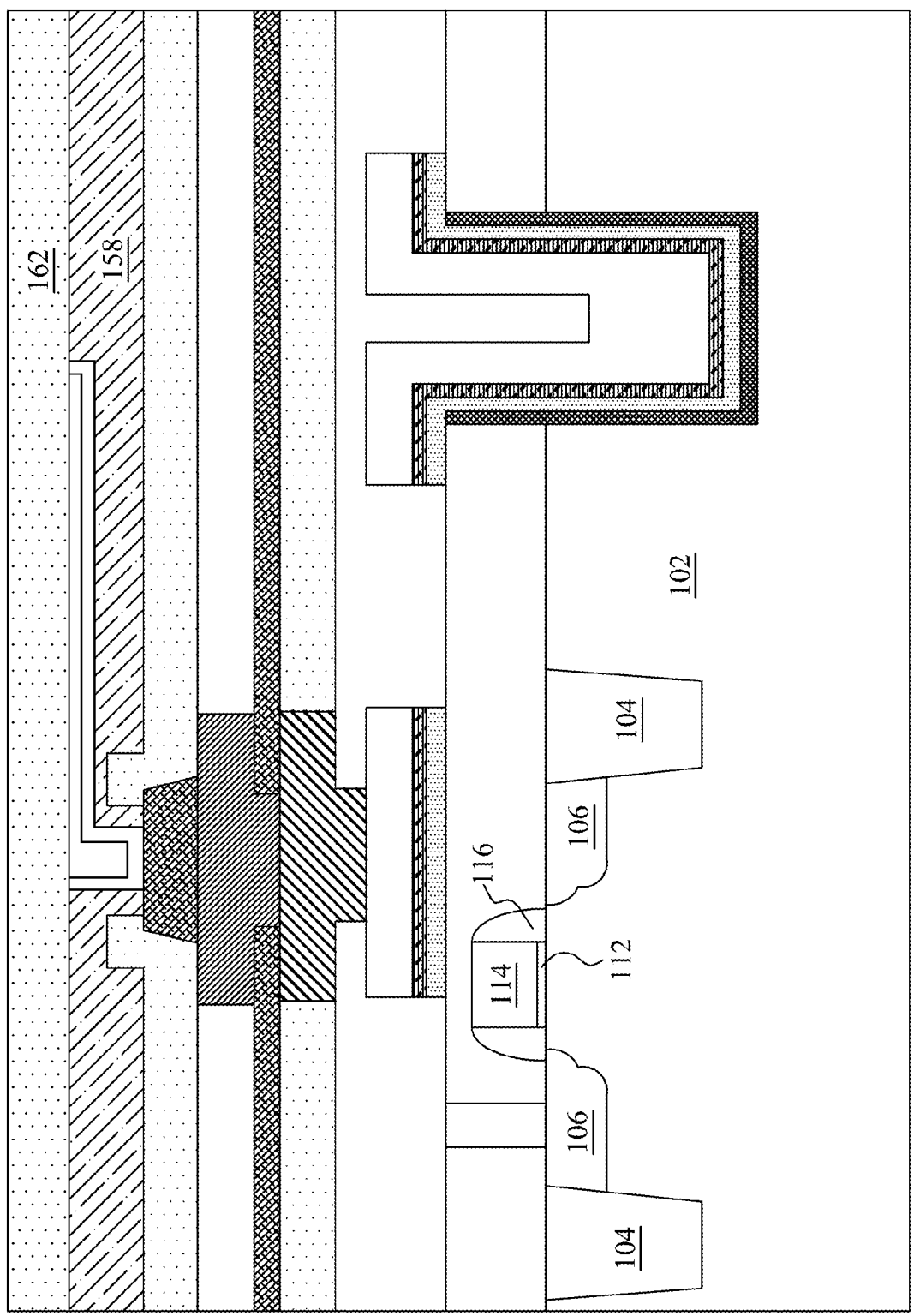
FIG. 18 illustrates a cross sectional view of the semiconductor device shown in FIG. 17 after a second polymer layer is formed over the semiconductor device in accordance with an embodiment.

FIG. 18 illustrates a cross sectional view of the semiconductor device shown in FIG. 17 after a second polymer layer is formed over the semiconductor device in accordance with an embodiment. The second polymer layer 162 is formed on top of the first polymer layer 158. The second polymer layer 162 is made of polymer materials such as epoxy, polyimide, polybenzoxazole (PBO), silicone, benzocyclobutene (BCB), molding compounds and/or the like and/or the like. The second polymer layer 162 may be deposited on the first polymer layer 158 using suitable deposition techniques such as spin coating. The second polymer layer 158 may be of a thickness in a range from about 4 um to about 10 um.

Figure 19:
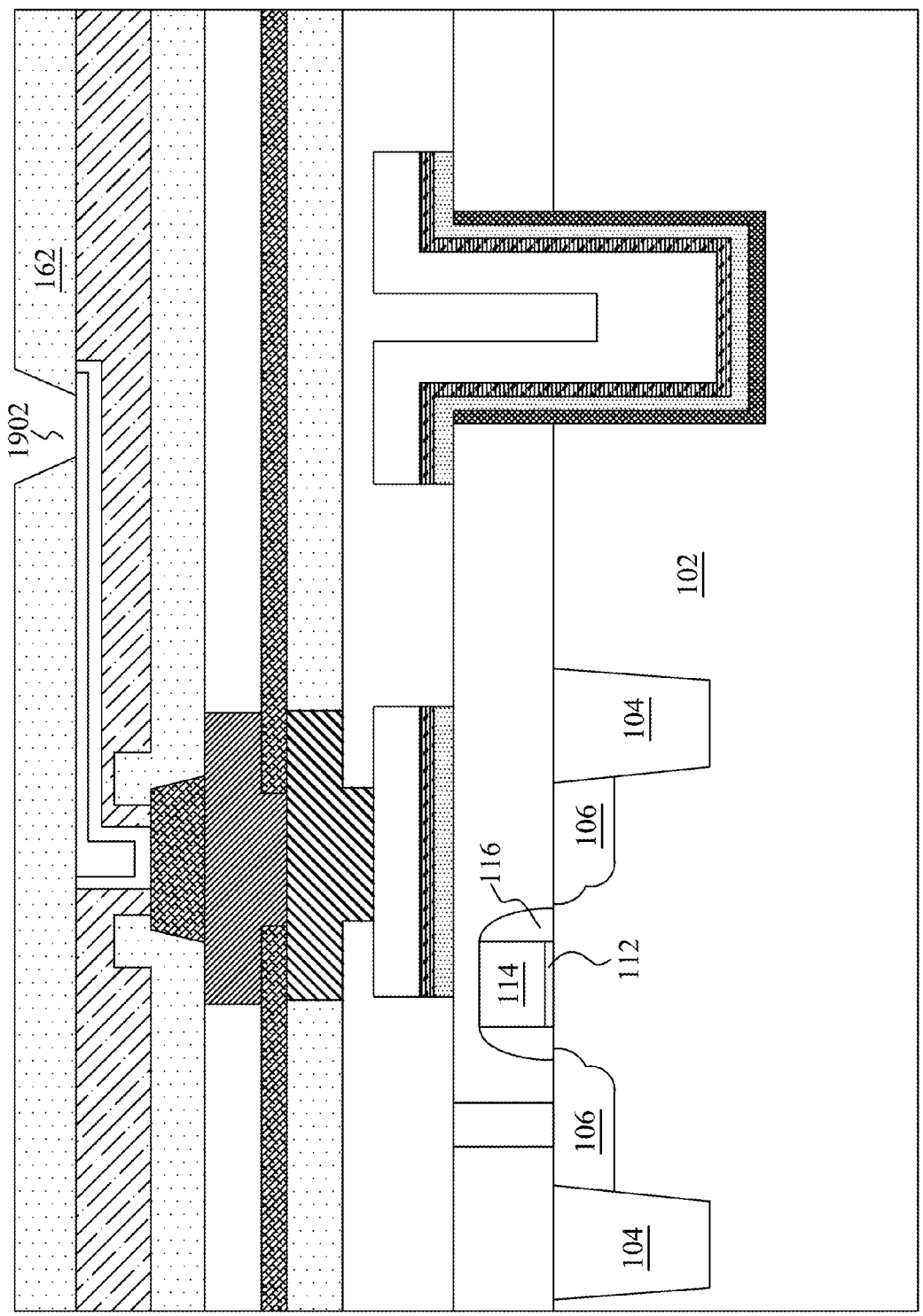
FIG. 19 illustrates a cross sectional view of the semiconductor device shown in FIG. 18 after a patterning process is applied to the surface of the second polymer layer in accordance with an embodiment.

FIG. 19 illustrates a cross sectional view of the semiconductor device shown in FIG. 18 after a patterning process is applied to the top surface of the second polymer layer in accordance with an embodiment. The patterning process may be implemented by using lithography and etch processes. Alternatively, the patterning process may be implemented by using a laser ablation process. According to the shape and location of the under bump metallization (UBM) structure (not shown but illustrated in FIG. 24), an etching process or a laser beam may be applied to the top surface of the second polymer layer 162 to form an opening 1902.

Figure 20:
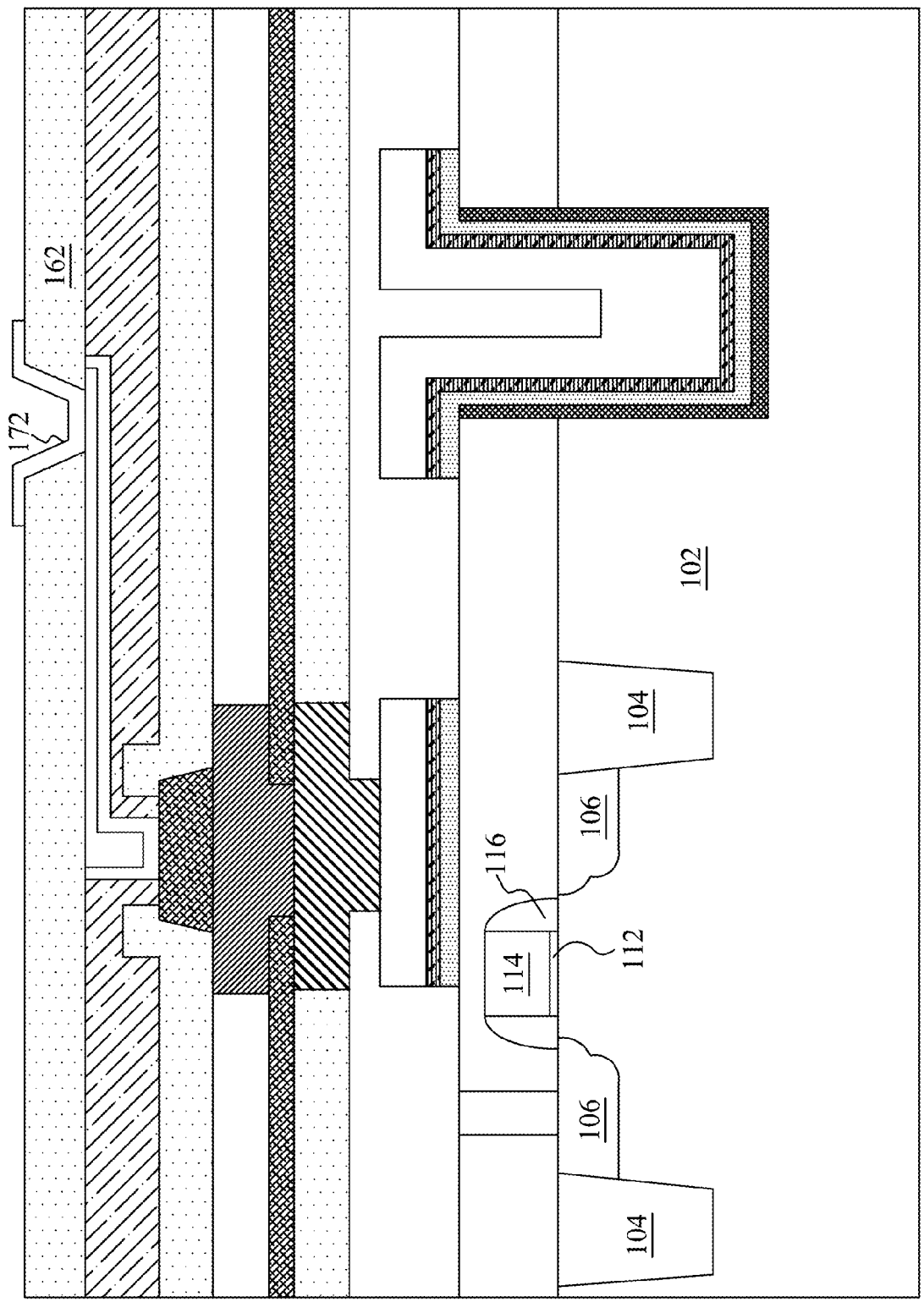
FIG. 20 illustrates a cross sectional view of the semiconductor device shown in FIG. 19 after a UBM seed layer is formed on top of the second polymer layer in accordance with an embodiment.

FIG. 20 illustrates a cross sectional view of the semiconductor device shown in FIG. 19 after a UBM seed layer is formed on top of the second polymer layer in accordance with an embodiment. The UBM seed layer 172 is deposited on the second polymer layer 162. The UBM seed layer 172 may comprise conductive materials such as copper and/or the like. The UBM seed layer 172 may be implemented by using suitable fabrication techniques such as sputtering, CVD and/or the like.

Figure 21:
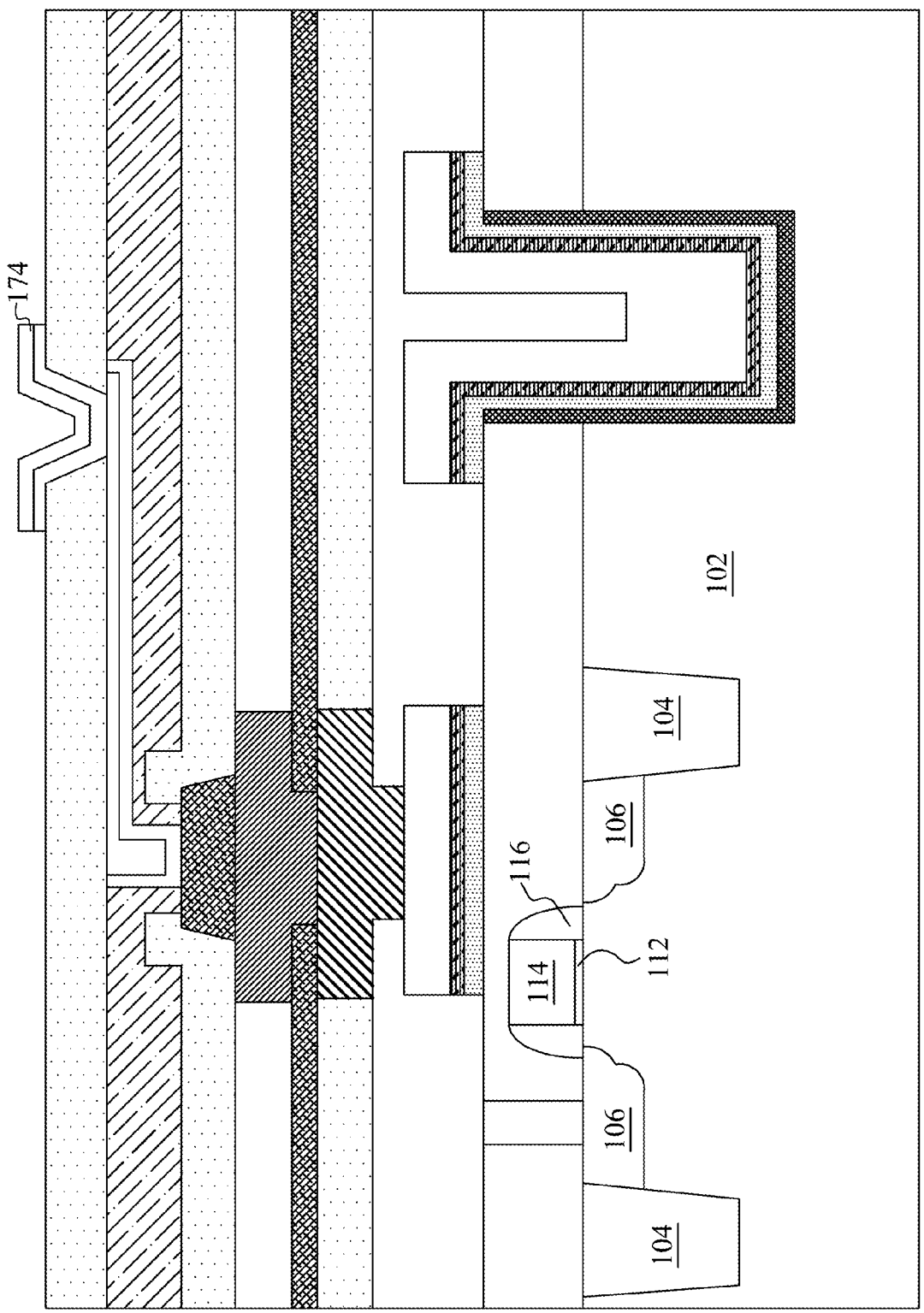
FIG. 21 illustrates a cross sectional view of the semiconductor device shown in FIG. 20 after a second conductive layer is formed on top of the UBM seed layer in accordance with an embodiment.

FIG. 21 illustrates a cross sectional view of the semiconductor device shown in FIG. 20 after a second conductive layer is formed on top of the UBM seed layer in accordance with an embodiment. As shown in FIG. 21, in order to obtain a reliable UBM structure, additional conductive materials may be deposited in a conformal manner on top of the UBM seed layer 172 to form an additional conductive layer 174. The conductive material may be copper, but can be any suitable conductive materials, such as copper alloys, aluminum, tungsten, silver, any combinations thereof and/or the like. The conductive layer 174 may be formed by suitable techniques such as an electro-less plating process.

Figure 22:
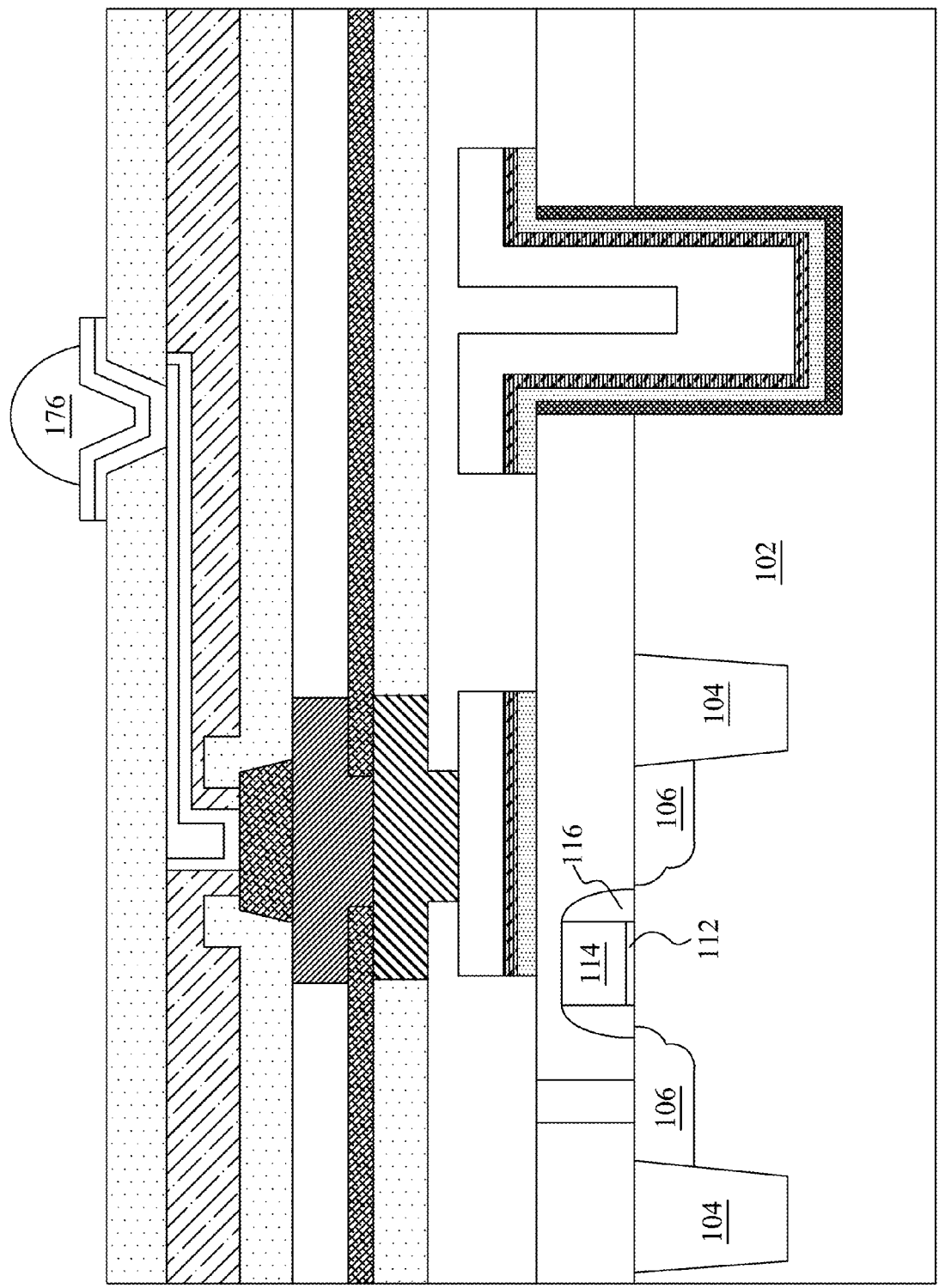
FIG. 22 illustrates a cross section view of the semiconductor device shown in FIG. 21 after an interconnect bump is formed on the UBM structure in accordance with an embodiment.

FIG. 22 illustrates a cross section view of the semiconductor device shown in FIG. 21 after an interconnect bump is formed on the UBM structure in accordance with an embodiment. The interconnect bump 176 provides an effective way to connect the semiconductor device with external circuits (not shown). In accordance with an embodiment, the interconnect bump 176 may be a solder ball. The solder ball 176 may be made of any of suitable materials. In accordance with an embodiment, the solder ball 176 may comprise SAC405. SAC405 comprises 95.5% Sn, 4.0% Ag and 0.5% Cu.

In accordance with another embodiment, the interconnect bump 176 may be a copper bump. The copper bump may be of a height of approximately 45 um. The copper bump may be formed by using a variety of semiconductor packaging technologies such as sputtering, electroplating and/or the like.

Figure 23:
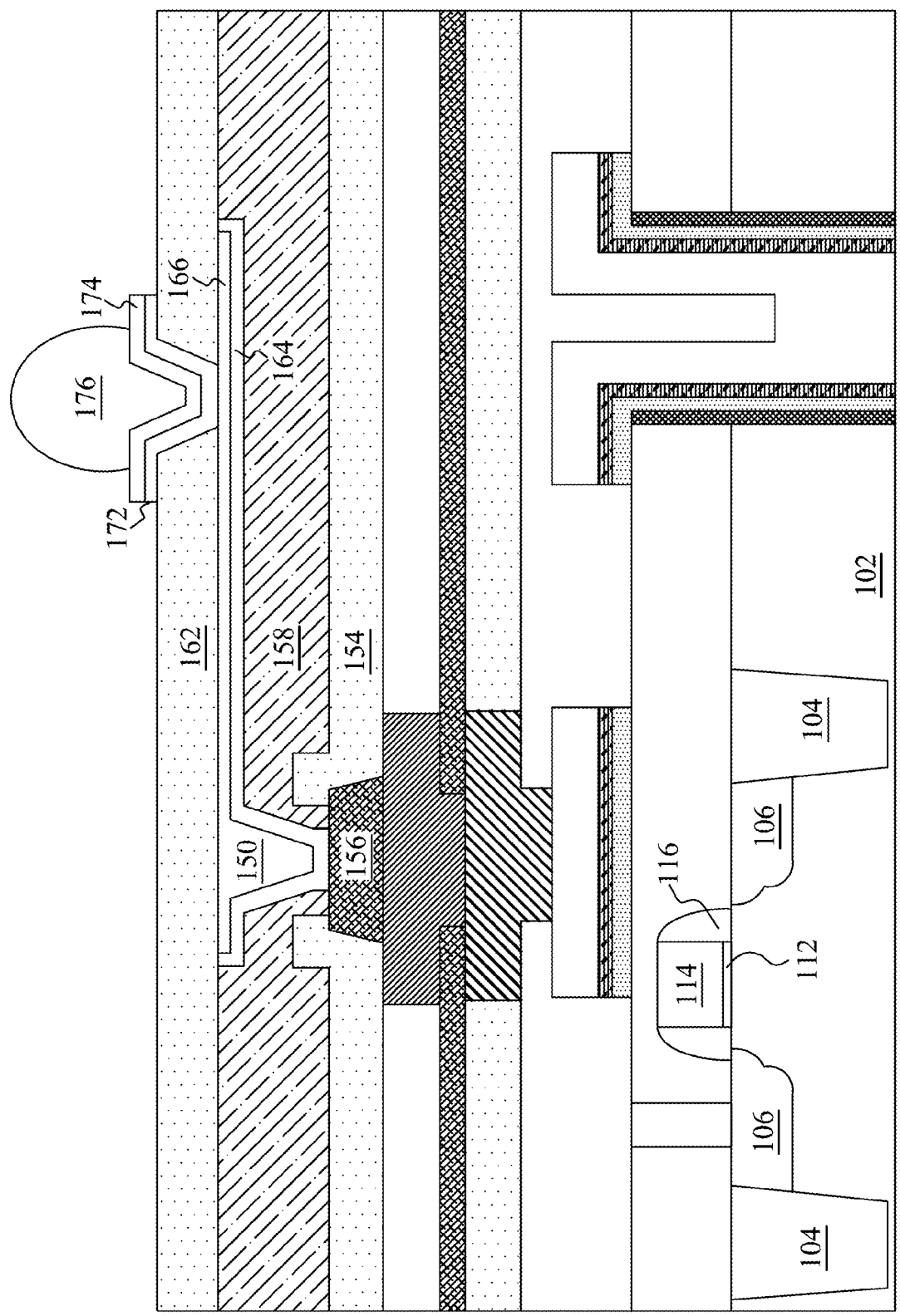
FIG. 23 is a cross sectional view of the semiconductor device illustrated in FIG. 22 after a thinning process has been applied to the second side of the substrate in accordance with an embodiment.

FIG. 23 is a cross sectional view of the semiconductor device illustrated in FIG. 22 after a thinning process has been applied to the second side of the substrate in accordance with an embodiment. According to the fabrication processes of through vias, the second side (a.k.a. backside) of the substrate 102 is thinned until the conductive material of the through via is exposed.

The thinning process may be implemented by using suitable techniques such as grinding, polishing and/or chemical etching, a combination of etching and grinding techniques. In accordance with an embodiment, the thinning process may be implemented by using a CMP process. In the CMP process, a combination of etching materials and abrading materials are put into contact with the backside of the substrate and a grinding pad (not shown) is used to grind away the backside of the substrate 102 until the conductive material of the through via is exposed.

Figure 24:
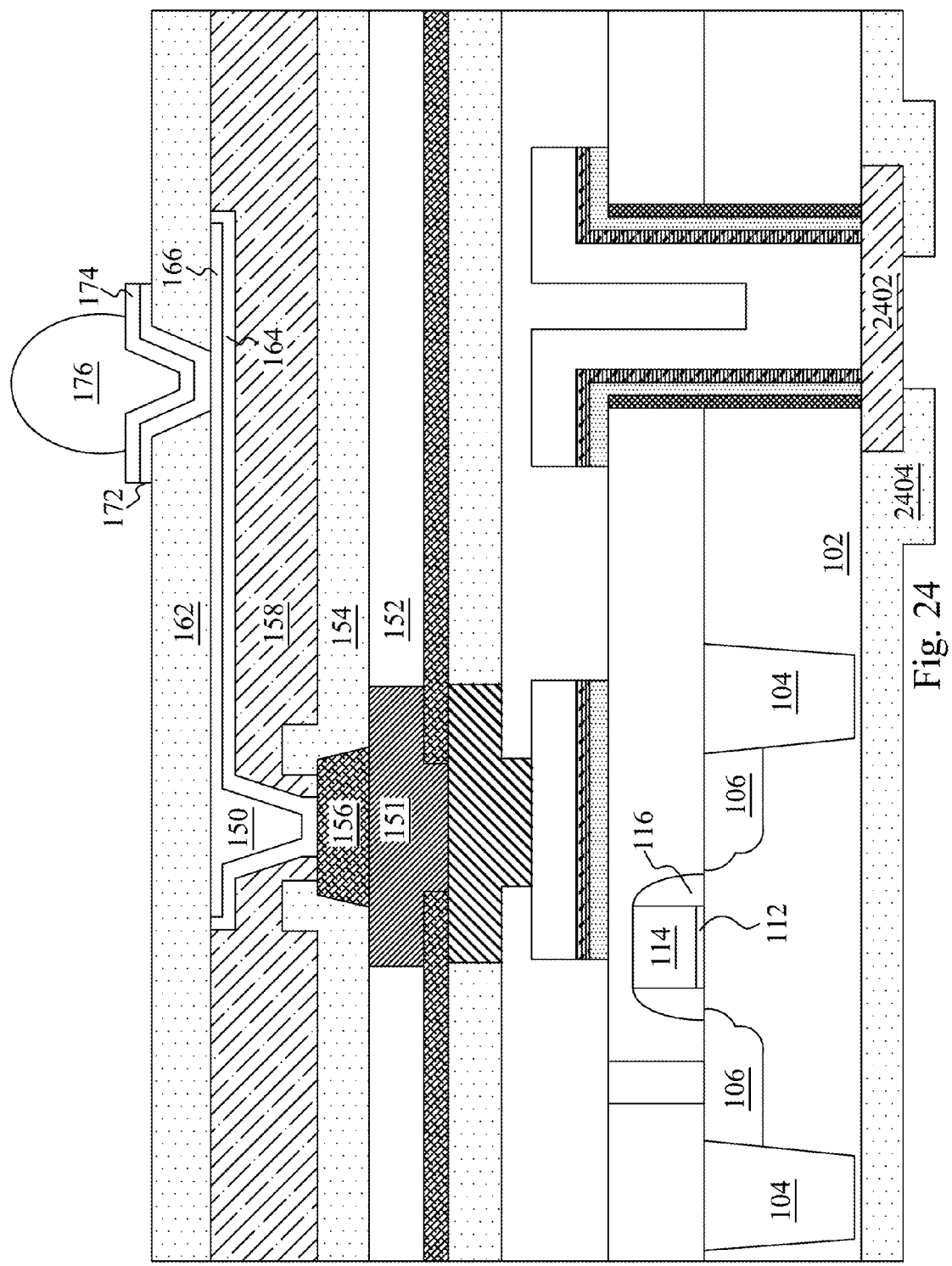
FIG. 24 illustrates a cross section view of the semiconductor device shown in FIG. 23 after a backside contact is formed on the second side of the substrate in accordance with an embodiment.

FIG. 24 illustrates a cross section view of the semiconductor device shown in FIG. 23 after a backside contact is formed on the second side of the substrate in accordance with an embodiment. A cleaning process may be employed to remove any remaining residue such as copper oxide on the backside of the substrate 102, a backside contact 2402 may be formed on the second side of the substrate 102 in electrical contact with the conductive material located within the through via.

The backside contact 2402 may comprise a conductive layer (not shown) and an electro-less nickel immersion gold (ENIG) layer (not shown). The conductive layer may comprise aluminum and may be formed through a sputter deposition process. However, other materials, such as nickel, copper and/or the like may alternatively be used. In addition, other formation processes such as electroplating or electro-less plating may alternatively be employed to form the conductive layer. The conductive layer may be formed with a thickness of between about 0.5 µm and about 3 µm.

The formation of the conductive layer may be followed by an ENIG process to form the ENIG layer. The ENIG process may comprise cleaning the conductive layer, immersing the substrate 102 in a zincate activation solution, electrolessly plating nickel onto the conductive layer, and electrolessly plating gold onto the nickel.

Alternatively, the formation of the conductive layer may be followed by other conductive layers similar to the ENIG layer. For example, the conductive layer may be an electro-less nickel electro-less palladium immersion gold (ENEPIG) layer, which includes a nickel layer, a palladium layer on the nickel layer and a gold layer on the palladium layer. Furthermore, the ENIG or ENEPIG layer may be replaced by other similar conductive layers such as an electro-less nickel electro-less palladium (ENEP) layer, a direct immersion gold (DIG) layer and/or the like.

A backside passivation layer 2404 may be partially formed over the backside contact 2402 in order to seal and protect the backside contact 2402. The backside passivation layer 2404 may comprise a dielectric material such as an oxide or silicon nitride, although other suitable dielectrics, such as a high-k dielectric, may alternatively be used.

The backside passivation layer 2404 may be formed using a PECVD process, although any other suitable process may alternatively be used. Once the backside passivation layer 2404 is deposited on the second side of the substrate, in order to expose at least a portion of the backside contact 2402, a patterning process may be applied to the backside passivation layer 2404. A suitable etching technique may be applied to the backside passivation layer 2404 so that the backside contact 2402 is exposed. As a result, exterior devices (not shown) may be connected to the backside contact 2402.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
an interlayer dielectric layer formed on a first side of a substrate, wherein the substrate comprises a plurality of active circuits adjacent to the first side of the substrate, wherein the interlayer dielectric layer has a first side opposite the substrate;
a first metallization layer formed over the interlayer dielectric layer, wherein the first metallization layer comprises a first metal line;
a backside contact formed over a second side of the substrate; and
a through via in the substrate, wherein the through via comprises a second metal line extending over the first side of the interlayer dielectric layer and along sidewalls of an opening in the interlayer dielectric layer and the substrate to the backside contact, the second metal line completely filling the opening at the second side of the substrate, and wherein a thickness of the second metal line along the sidewalls of the opening is less than a thickness of the second metal line adjacent to the backside contact; and
a dielectric layer over the second metal line, the dielectric layer extending into the opening.

2. The apparatus of claim 1, further comprising:
a liner layer on the sidewalls of the opening, wherein the liner layer is formed of a second dielectric material;
a barrier layer on the liner layer; and
a seed layer on the barrier layer.

3. The apparatus of claim 1, wherein:
a bottom surface of the dielectric layer is lower than a top surface of the substrate.

4. The apparatus of claim 1, wherein:
a top surface of the first metal line is level with a top surface of the second metal line.

5. The apparatus of claim 1, wherein:
the dielectric layer is formed of a photo sensitive polymer material.

6. The apparatus of claim 1, wherein:
a width of the backside contact is greater than a width of the opening.

7. The apparatus of claim 1, wherein:
the second metal line is formed of copper.

8. An apparatus comprising:
a substrate comprising a plurality of transistors adjacent to a first side of the substrate;
an interlayer dielectric layer on the first side of the substrate, wherein at least one gate structure is in the interlayer dielectric layer;
a first metallization layer formed over the interlayer dielectric layer, wherein the first metallization layer comprises a first metal line and a second metal line;
a backside contact on a second side of the substrate;
a through via in the substrate and the interlayer dielectric layer, wherein the through via comprises the second metal line extending along sidewalls of an opening in the interlayer dielectric layer and the substrate to the backside contact, the second metal line completely filling a portion of the opening adjacent to the second side of the substrate, and wherein a center portion of the backside contact is connected to and in direct contact with the second metal line;
a bump over the first side of the substrate, wherein the bump is electrically connected with the first metal line through a plurality of interconnect structures; and
a dielectric layer over the second metal line, the dielectric layer extending into the opening.

9. The apparatus of claim 8, further comprising:
a first barrier layer and a first seed layer between a top surface of the interlayer dielectric layer and the first metal line.

10. The apparatus of claim 9, further comprising:
a second barrier layer and a second seed layer between the top surface of the interlayer dielectric layer and the second metal line.

11. The apparatus of claim 10, wherein:
a thickness of the first barrier layer is equal to a thickness of the second barrier layer; and
a thickness of the first seed layer is equal to a thickness of the second seed layer.

12. The apparatus of claim 8, wherein:
a bottom surface of the dielectric layer is lower than a top surface of a drain/source region in the substrate.

13. The apparatus of claim 8, further comprising:
a backside passivation layer over the second side of the substrate, wherein sidewalls of the backside contact are enclosed by the backside passivation layer.

14. The apparatus of claim 8, wherein:
the first metal line and the second metal line are formed of copper.

15. An apparatus comprising:
an interlayer dielectric layer on a first side of a substrate, the substrate comprising a transistor on the first side of the substrate;
a first metal line in a first metallization layer over the interlayer dielectric layer;
a second metal line in the first metallization layer, wherein a top surface of the first metal line is substantially level with a top surface of the second metal line;
a backside contact on a second side of the substrate;
a through via extending through the substrate and the interlayer dielectric layer, wherein the through via comprises the second metal line extending along sidewalls of an opening in the interlayer dielectric layer and the substrate to the backside contact, the second metal line completely filling a portion of the opening adjacent to the second side of the substrate, and wherein a center portion of the backside contact is connected to and in direct contact with the second metal line, and wherein a width of the backside contact is greater than a width of the opening, and wherein a thickness of a portion of the second metal line adjacent to the second side of the substrate is greater than a thickness of a portion of the second metal line adjacent to the sidewalls of the opening; and
a dielectric layer over the second metal line, the dielectric layer extending into the opening, wherein a bottommost surface of the dielectric layer is higher than a bottommost surface of a drain/source region of the transistor.

16. The apparatus of claim 15, further comprising:
a first liner layer on the sidewalls of the opening;
a first portion of a first barrier layer on the first liner layer; and a first portion of a first seed layer on the first portion of the first barrier layer.

17. The apparatus of claim 16, further comprising:

a second portion of the first barrier layer between a top surface of the interlayer dielectric layer and the second metal line, wherein the first portion of the first barrier layer and the second portion of the first barrier layer form an L-shaped barrier layer comprising a vertical portion extending through the substrate and the interlayer dielectric layer, and a horizontal portion over the top surface of the interlayer dielectric layer; and a second portion of the first seed layer over the second portion of the first barrier layer, wherein the first portion of the first seed layer and the second portion of the first seed layer form an L-shaped seed layer comprising a vertical portion extending through the substrate and the interlayer dielectric layer, and a horizontal portion over the top surface of the interlayer dielectric layer.

18. The apparatus of claim 17, wherein:

a thickness of the first portion of the first barrier layer is equal to a thickness of the second portion of the first barrier layer; and a thickness of the first portion of the first seed layer is equal to a thickness of the second portion of the first seed layer.

19. The apparatus of claim 15, wherein:

the dielectric layer is formed of a photo sensitive polymer material.

20. The apparatus of claim 15, further comprising:

a first interconnection structure over the first side of the substrate; and a second interconnection structure over a second side of the substrate, wherein the second interconnection structure is coupled to the first interconnection structure through the through via.

* * * * *